United States Patent
Sato et al.

(10) Patent No.: US 7,022,558 B2
(45) Date of Patent: Apr. 4, 2006

(54) METHOD OF MANUFACTURING AN ACTIVE MATRIX SUBSTRATE AND AN IMAGE DISPLAY DEVICE USING THE SAME

(75) Inventors: Takeshi Sato, Kokubunji (JP); Kazuo Takeda, Tokorozawa (JP); Masakazu Saito, Mobara (JP); Jun Goto, Mobara (JP); Makoto Ohkura, Fuchu (JP)

(73) Assignees: Hitachi, Ltd., Tokyo (JP); Hitachi Displays, Ltd., Tokyo (JP)

( * ) Notice: Subject to any disclaimer, the term of this patent is extended or adjusted under 35 U.S.C. 154(b) by 0 days.

(21) Appl. No.: 10/712,712

(22) Filed: Nov. 14, 2003

(65) Prior Publication Data

US 2004/0232432 A1 Nov. 25, 2004

(30) Foreign Application Priority Data

May 21, 2003 (JP) .......................... P2003-143803

(51) Int. Cl.
*H01L 21/00* (2006.01)

(52) U.S. Cl. .................. 438/150; 438/149; 438/166

(58) Field of Classification Search ................ 438/149, 438/150, 166; 430/270.1; 257/192; 219/121.65
See application file for complete search history.

(56) References Cited

U.S. PATENT DOCUMENTS 6,081,632 A * 6/2000 Yoshimura et al. ............ 385/5
6,191,855 B1 * 2/2001 Maris .......................... 356/244
6,296,978 B1 * 10/2001 Takaya et al. .............. 430/58.2

(Continued)

FOREIGN PATENT DOCUMENTS

JP   6-140323   10/1992

(Continued)

OTHER PUBLICATIONS

Chang-ho Oh and Masakiyo Matsumura, "Preparation of Position-Controlled Crystal-Silicon Island Arrays by Means of Excimer-Laser Annealing", Jpn. J. Appl. Phys., vol. 37(1998) pp. 5474-5479.

(Continued)

*Primary Examiner*—Alexander Ghyka
(74) *Attorney, Agent, or Firm*—Reed Smith LLP; Stanley P. Fisher, Esq.; Juan Carlos A. Marquez, Esq.

(57) ABSTRACT

The present invention provides a manufacturing method of a high performance active matrix substrate at a high throughput with a less expensive apparatus, and an image display device using the active matrix substrate. On a stage moving in the short axis direction X and long axis direction Y on a rail, a glass substrate is carried, which has an amorphous silicon semiconductor film formed. Polycrystallized and large grain silicon film may be obtained by intensity modulating the pulsed laser beam in a line beam shape by means of a phase shift mask with a periodicity in the long axis direction Y of the laser beam, moving the laser beam randomly in the modulation direction of the amorphous silicon semiconductor film formed on the glass substrate to expose to crystallize the film. The image display device may incorporate an active matrix substrate having active elements such as thin film transistors formed by this silicon film.

12 Claims, 21 Drawing Sheets

U.S. PATENT DOCUMENTS

| | | | |
|---|---|---|---|
| 6,402,037 B1 * | 6/2002 | Prasad et al. | 235/487 |
| 6,403,396 B1 * | 6/2002 | Gudesen et al. | 438/99 |
| 6,452,710 B1 * | 9/2002 | Hiraga et al. | 359/244 |
| 6,456,416 B1 * | 9/2002 | Ichimura et al. | 359/241 |
| 6,713,753 B1 * | 3/2004 | Rovira et al. | 250/225 |
| 6,756,614 B1 * | 6/2004 | Hatano et al. | 257/192 |
| 6,803,777 B1 * | 10/2004 | Pfaff et al. | 324/752 |
| 6,847,050 B1 * | 1/2005 | Yamazaki et al. | 257/59 |
| 6,861,614 B1 * | 3/2005 | Tanabe et al. | 219/121.66 |
| 6,870,126 B1 * | 3/2005 | Jyumonji et al. | 219/121.65 |

FOREIGN PATENT DOCUMENTS

| | | |
|---|---|---|
| JP | 2001-274088 | 5/1996 |
| JP | 2002-280302 | 3/2001 |

OTHER PUBLICATIONS

Do-Hyun Choi, Kazuhiro Shimizu, Osamu Sugiura and Masakiyo Matsumura, "Drastic Enlargement of Grain Size of Excimer-Laser-Crystallized Polysilicon Films", Jpn. J. Appl. Phys., vol. 31 (1992) pp. 4545-4549.

Koichi Murakami, Tetsuo Takahashi, Tadamasa Koyanagi, Koichiro Hoh, Yoshio Komiya and Yasuo Tarui, "Thermal Analysis and Experimental Evaluation of Melting Threshold Energy of Si Thin Film Structure in Laser Annealing" Japanese Journal of Applied Physics, vol;. 21, No. 6, Jun. 1982, pp. 879-884.

* cited by examiner

METHOD OF MANUFACTURING AN ACTIVE MATRIX SUBSTRATE AND AN IMAGE DISPLAY DEVICE USING THE SAME

PRIORITY CLAIM

This application claims priority to Japanese patent application P2003-143803 filed May 21, 2003 the entire disclosure of which is hereby incorporated by reference.

FIELD OF THE INVENTION

The present invention relates to a method of manufacturing an active matrix substrate having a driver circuit using a low temperature polysilicon semiconductor layer and to an image display device using the same.

BACKGROUND OF THE INVENTION

LCD (liquid crystal display) and EL (electroluminescence display) are in their development or commercial stage, as image display devices of so-called flat panel type. Since the liquid crystal display is thin and lower in consumption power, it is used for monitors for personal computers and various information processing units, or television receiver sets. The electroluminescence display on the other hand is light emitting type, which does not require any external light source used for example in the liquid crystal display devices, allowing making thinner and light weight image display devices. The active matrix image display of such devices uses an active matrix. substrate having a number of pixel circuits of matrix arrangement, active elements that drives the matrix circuits, pixel driver circuit that drives pixel circuits, and any other auxiliary circuit necessary for image display formed on a same dielectric substrate. The pixel circuits and pixel driver circuits uses as circuitry elements active elements formed on a silicon semiconductor layer formed on the dielectric substrate constituting the active matrix substrate. The exemplary active element is thin film transistors.

Recently, adopting thin film transistors using low temperature polysilicon semiconductor film for those active elements to form the pixel driver and auxiliary circuits by the thin film transistor on a dielectric substrate to form an active matrix substrate is realized so as to obtain an image display device with high definition image and low manufacturing cost. Herein below low temperature polysilicon semiconductor film will be referred to as polysilicon film, or sometimes semiconductor film.

A widely used manufacturing method of semiconductor thin film of the type represented by the polysilicon semiconductor film may be laser crystallization method, conventionally consisted of forming an amorphous silicon semiconductor film on a dielectric substrate, exposing the amorphous silicon semiconductor film with laser beam and annealing and crystallizing. In particular in order to obtain a polysilicon semiconductor film on a large dielectric substrate such as the active matrix substrate used in the image display device for television receiver set, crystallization of multi-shot method or multi-shot laser crystallization method is used, in which a plurality of pulse excimer laser for yielding a higher output power is exposed for crystallization.

Multi shot laser crystallization method may yield a relatively large grain silicon crystal of the grain size of 0.5 μm or more. This may be useful for forming a semiconductor film having a high electron mobility suitable for the driver circuit contained in the active matrix substrate of an image display device. To obtain a uniform film of large size, it is common that the exposure pattern of the laser beam on the semiconductor film should be shaped to a rectangular, more specifically to a line beam in which the short axis width is extremely short with respect to the long axis width, and the dielectric substrate having semiconductor films formed thereon will be moved in relation to the short axis direction of the shaped beam during the exposure.

In the crystallization method of silicon thin film by the exposure of laser beam, narrowing the transfer distance of the laser beam during the exposure intervals between two laser pulses much smaller than the beam width (that is, the length of short axis) may obtain a good result of annealing effect. By uniformly forming a laser beam of line beam shape that has a long width in the long axis direction with respect to the width in the short axis direction, crystals may be grown with no gaps for a large area. Also, as an alternative method of obtaining a semiconductor film of high electron mobility with a larger grain size, crystallization using lateral growth is now being considered.

In the non-patent document 1, Japanese Journal of Applied Physics Vol. 31, (1992) pp. 4545–4549, it is disclosed that a larger grain crystal may be formed by exposing laser beams on an amorphous silicon semiconductor film while having the thermal capacity of the dielectric substrate differed to form a thermal gradient therein to cause growth of silicon crystals from the area of lower temperature to the area of higher temperature.

In the patent document 1, JP-A No. 140323/1994, it is disclosed a method that enlarges the grain size by modulating the excimer laser beam with a grating to expose an amorphous silicon semiconductor film with such a modulated beam to cause a temperature gradient and growth of crystals from the area of lower temperature to the area of higher temperature.

In the patent document 2, JP-A No. 274088/2001, it is disclosed a method that a sequential exposure of laser beam with translation of substrate of slight overlap to the previous melt zone to induce sequential growth of crystal in the lateral direction to form a large grain crystal, or it is referred to as SLS method. Another example of sequential exposure of pulse laser beam with a slight overlap to the previous melt zone is disclosed in the non-patent document 2, in which the pulsed laser beam is scanned while exposure on the amorphous silicon film. In this method it is described that the scan speed of the laser beam is 99 centimeters per second, and the frequency of laser beam is 2 kHz. The interval of 49.5 μm between two laser beam exposures may be calculated. In FIG. 9 of this reference it is described an example in which the melt width by each pulse of laser beam is more than 50 μm and a melting zone is overlapped to its previous melted zone.

In the patent document 3, JP-A No. 280302/2002 it is disclosed that a lateral growth method for forming a large grain crystal by exposing a laser beam of intensity modulated by the interference of laser beams while translating by the growth distance in the lateral direction. Another example of lateral grain growth method using laser modulation is disclosed in the non-patent document 3. In this paper, a phase shift mask, which is placed on the amorphous Si film substrate, modulate laser beam intensity periodically to induce lateral grain growth.

[Non-patent Document 1]
  Japanese Journal of Applied Physics Vol. 31, (1992) pp. 4545–4549

[Non-patent Document 2]
  Japanese Journal of Applied Physics Vol. 21, (1982) pp. 879–884

[Non-patent Document 3]
  Japanese Journal of Applied Physics Vol. 37, (1998) pp. 5474–5479

[Patent Document 1]
  JP-A No. 140323/1994

[Patent Document 2]
  JP-A No. 274088/2001

[Patent Document 3]
  JP-A No. 280302/2002

In order to improve the throughput when forming a large grain crystal by the above mentioned multi-shot laser crystallization for a semiconductor film formed on a dielectric substrate for use in an active matrix substrate of an image display device, it is imperative to reduce the number of shots of the laser beam. However, if the number of shots of laser beam is reduced when using a laser beam of uniform intensity without any modulation according to the prior art, the grain size of yielded crystal will be shrunk, resulting in a decrease of electron mobility, so that the improvement of throughput has been difficult.

On the other hand, in the semiconductor film crystallization method using the lateral growth, it is possible to decrease the number of shots of laser beam. However, in any conventional methods the relative position of laser beam with respect to the dielectric substrate should be controlled, by the length similar to the growth distance in the lateral direction. The lateral growth distance of a crystal-may depend on the silicon film thickness, substrate temperature at the crystallization, and the pulse duration time of irradiated laser beam. For example when melting and crystallizing a silicon semiconductor substrate of film thickness of 50 nm with pulsed excimer laser beam of 25 nsec at the room temperature, lateral growth distance of crystals will be 1 μm or less. Therefore, the exposure position is required to be controlled at the precision of 1 μm or more. This requires a highly accurate translating mechanism, resulting in a higher installation cost.

SUMMARY OF THE INVENTION

The present invention has been made in view of the above circumstances and has an object to overcome the above problems and to provide a method of manufacturing an active matrix substrate, allowing a higher throughput by the promotion of lateral growth of silicon crystal by means of a modulated laser beam, and allowing using a less expensive device, which incorporates a relative displacement mechanism of the laser beam to a dielectric substrate of an error larger than the lateral growth distance of crystal.

In order to achieve the above object, first feature of the manufacturing method of an active matrix substrate in accordance with the present invention includes forming a semiconductor film on a dielectric substrate, and when crystallizing the semiconductor film by exposing a laser beam modulated periodically on the semiconductor film, moving randomly the exposure position of the laser beam in the periodic direction. This allows lateral growth by using an apparatus having an error of the relative displacement mechanism of the laser beam to the dielectric substrate larger than the lateral growth distance, thus allowing a higher throughput when using a less expensive apparatus.

A second feature of the manufacturing method of an active matrix substrate in accordance with the present invention includes dividing zones smaller than the crystal grain of semiconductor film formed on the dielectric substrate, promoting lateral growth using thus divided crystal grains as the nuclei to reform a unique crystal grain to allow crystallization of semiconductor film. This method does not create a new grain boundary regardless of the relative exposure position of laser beam with respect to the dielectric substrate, allowing forming a high quality crystal of uniform grain size in combination with the above-mentioned first feature of random displacement.

A third feature of the manufacturing method of an active matrix substrate in accordance with the present invention includes exposing a pulsed laser beam modulated periodically so as to have a first periodicity, and exposing another laser beam modulated so as to have a second periodicity smaller than the first periodicity to crystallize the semiconductor film. This second pass with the second cycle smooths the surface of semiconductor film while the grain size stays the same. In order words, the peaks over hillocks are smoothed out to forma smoother surface by the second pass. By using this in combination with the above-mentioned features, a semiconductor film having an isotropic crystallinity may be obtained with a less expensive apparatus. Also a flat film may be yielded which is appropriate for forming thin film transistors.

An feature of image display device in accordance with the present invention includes arranging a plurality of pixel circuits on the pixel area on a dielectric substrate of an active matrix substrate, arranging a pixel driver circuit and auxiliary circuit outside the display area, and being formed by thin film transistors using as channels semiconductor thin film having these pixel circuit and pixel driver circuit or other circuits manufactured according to any one of above manufacturing methods.

Another feature of image display device in accordance with the present invention includes a plurality of wirings intersecting, each with other on the display area of the dielectric substrate forming the active matrix substrate, pixel circuit arranged in the vicinity of the intersection of wirings for varying the transmittance or reflectance or amount of light emission, a thin film transistor including a semiconductor thin film in the pixel circuit used for a channel, the film having a switching element manufactured in any one of the above mentioned manufacturing methods for selectively driving the pixel.

Another feature of the image display device in accordance with the present invention includes a plurality of wirings intersecting each with other on the display area of the dielectric substrate forming the active matrix substrate, a pixel circuit made of light emitting element s in the vicinity of the intersection of wirings, a thin film transistor including a semiconductor thin film in the pixel circuit used for a channel, the film having a switching element manufactured in any one of the above mentioned manufacturing methods for selectively driving the pixel, using a semiconductor film manufactured in any one of the above mentioned manufacturing methods for the channel of the thin film transistor selectively driving the light emitting element, so as for the channel length to be a multiple of natural number of the periodicity of hillocks of the semiconductor film, with the channel direction in parallel to the direction of periodicity of hillocks of the semiconductor film.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

It is to be understood that the present invention is not to be limited to the details herein given but may be modified within the scope of the appended claims.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

DETAILED DESCRIPTION OF THE PREFERRED EMBODIMENTS

Figure 1:
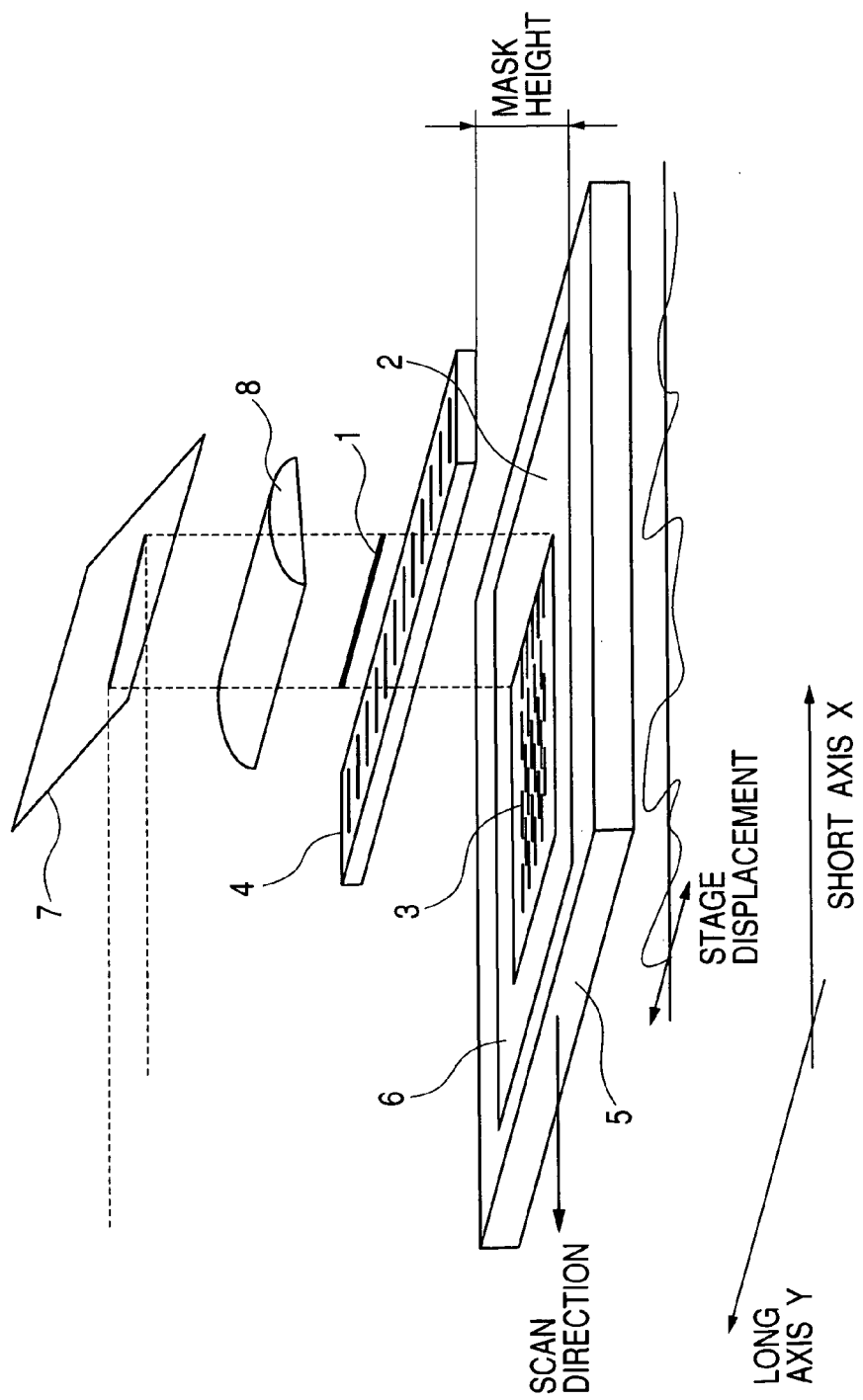
FIG. 1 is a schematic diagram of an embodiment of manufacturing method of an active matrix substrate in accordance with the present invention.

A detailed description of preferred embodiments of the manufacturing method of an active matrix substrate and image display device using the active matrix substrate, embodying the present invention will now be given referring to the accompanying drawings. Referring to FIG. 1, there is shown a schematic diagram illustrating a preferred embodiment of manufacturing method of an active matrix substrate in accordance with the present invention. The reference numeral 1 in FIG. 1 designates a pulsed laser beam, 2 an amorphous silicon semiconductor film, 3 a polysilicon semiconductor film (also referred to as polysilicon film, polysilicon Si film herein below), 4 a phase shift mask, 5 a stage, 6 a dielectric substrate (usually made of glass, and will be referred to as a glass substrate or simply substrate herein below), 7 a mirror, and 8 a cylindrical lens.

On a stage 5 translating on a rail in the short axis direction X and long axis direction Y, a glass substrate 6 is carried on thereto having an amorphous silicon semiconductor film 2 (also referred to as an amorphous Si film herein below) formed thereon. A pulsed laser beam 1 in a shape of line beam is intensity modified or modulated by means of a phase shift mask 4 periodic in the long axis Y direction of the laser beam to expose to the amorphous silicon semiconductor film 2 formed on the glass substrate 6. The phase shift mask 4 has a number of very fine slits formed its mask surface, disposed as a periodic array, which array has its functionality of modulating the phase of transmitted laser beam, and of periodically modulating the intensity due to the interference. The laser beam 1 is adjusted so as to form a beam shape of approximately flat fluence in the short axis X direction on the glass substrate 6, i.e., a top flat shape, by the optics including the cylindrical lens 8 that serves as light condensing of laser beam in the short axis X direction if there is not a phase shift mask 4.

The temperature at laser beam exposure may be at room temperature, N2 gas not shown in the figure is supplied to flow between the glass substrate 6 and the phase shift mask 4 during the exposure of laser beam 1. Also, the mask surface of the phase shift mask 4 and the glass substrate 6 are maintained to be leveled in order to maintain the constant modulation of laser beam on the glass substrate 6. A pulsed excimer laser beam of wavelength of 308 nm is used for the laser beam 1.

The periodicity of slits of the phase shift mask 4 may be set to be in the range of 2 µm to 10 µm, for shaping a laser beam having a modulation periodicity in the range of 0.5 µm to 10 µm. In this preferred embodiment the periodicity of the phase shift mask 4 is set to 3 µm. The phase shift mask 4 is made of quartz, having striped steps formed periodically so as to create a phase difference of 180 degrees for the laser beam of wavelength 308 nm, between two adjacent steps. When the height of the phase shift mask 4 from the glass substrate 6 is set to be 0.9 millimeter, an intensity modulation of the 1.5-µm period, that is, a half of the period of a phase shift mask has been obtained. The laser beam modulation by the phase shift mask 4 may also include other components of period of fractions of the slit period, other than the half period above.

The optics for shaping the laser beam 1 to a line beam splits the incoming laser beam into a plurality of beams each having slightly different incident angle and then irradiate the glass substrate 6 on the process of magnifying beam length. When emitting such laser beam into the phase shift mask 4, every modulated components are averaged depending on the height from the glass substrate 6 to the phase shift mask 4, resulting in an emphasis of a specific periodic component. Therefore when using the arrangement in accordance with the preferred embodiment, modulation of any other period other than a half of slit period of the phase shift mask 4 such as ⅔ period may be obtained.

When forming a semiconductor film, the laser beam 1 will be oscillated at a repeated constant frequency such as at 300 Hz, scans the stage 5 in the short axis X direction of the laser beam at a constant speed while moving randomly in the long axis Y direction to expose the laser beam 1 to the glass substrate 6 to crystallize the amorphous silicon semiconductor film 2 on the glass substrate 6 to form sequentially a polysilicon film 3.

As a method of moving the exposure position in the modulation period, i.e., in the long axis Y direction of the laser beam 1, a translation mechanism of stage 5 in the long axis Y direction may be used to reciprocally move in the admissible tolerance of irradiation error for example on the order of 0.1 millimeter. The translation of the stage 5 usually is accompanied by a back rush of the order of micrometers, causing an error of the level comparable to the modulation period of the laser beam, during a reciprocation, resulting in a randomized amount of travel distance. For moving randomly, a swell of the amplitude of the order of few microns is formed on the rail to travel the stage 5 on the swell. Alternatively instead of moving the stage 5, a mechanism of vibrating the phase shift mask 4 may be provided. In addition, by oscillating the angle of the mirror 7 that reflects the laser beam 1 incident to the phase shift mask 4, the incident angle of laser beam may be oscillated in relation to the modulation direction of the phase shift mask 4 so as to displace the intensity distribution of the laser beam 1.

Figure 2:
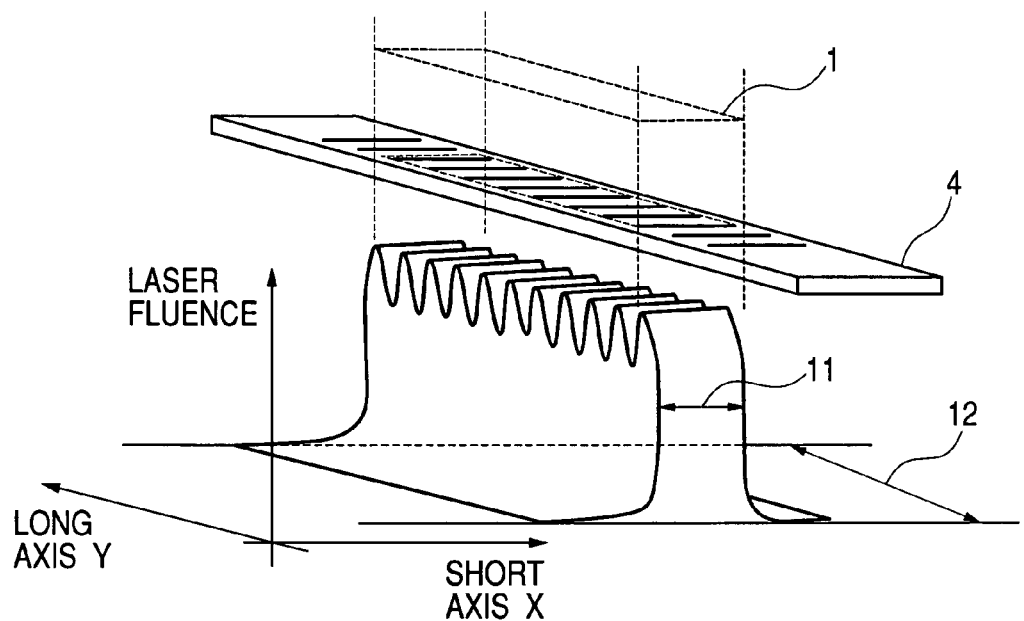
FIG. 2 is a schematic diagram of laser beam intensity distribution used in the present invention.

Referring to FIG. 2, there is shown a schematic diagram of intensity distribution of laser beam used in accordance with the present invention. The beam shape of the laser beam 1 may be a very elongated rectangular, i.e., substantially a line form, for example, of 370 millimeters of width 12 in the long axis Y direction, 360 µm of width 11 in the short axis X direction. In the long axis direction of line beam of the phase shift mask 4 a periodic pattern is formed. The laser beam 1 having passed through the phase shift mask 4 may have a periodic intensity modulation in the Y direction formed. On the other hand, a top flat form is formed in the short axis X direction.

As in the present embodiment, by placing the periodic direction of the phase shift mask 4 in parallel to the long axis of the laser beam, the diffracted light beam by the phase shift mask will be diffracted into the long axis direction, and will remain within the line beam, resulting in that it has an advantage of avoiding the loss of laser beam 1. Also, since there may be no diffraction of the laser beam 1 in the short axis X direction, and the beam will remain in the form of top flat prior to transmission of the phase shift mask 4 in the short axis X direction, so that the mean fluence at the time of exposure of each shot can be approximately constant, resulting in that it has an advantage of superior process stability. In addition, as the laser beam 1 may arrive from the glass substrate 6 at the incident range of approximately 180 degrees, so that the optics can be considered to have a numerical aperture of 1 in the long axis Y direction, yielding a resolution as high as the wavelength, and very precipitous modulation.

Figure 3:
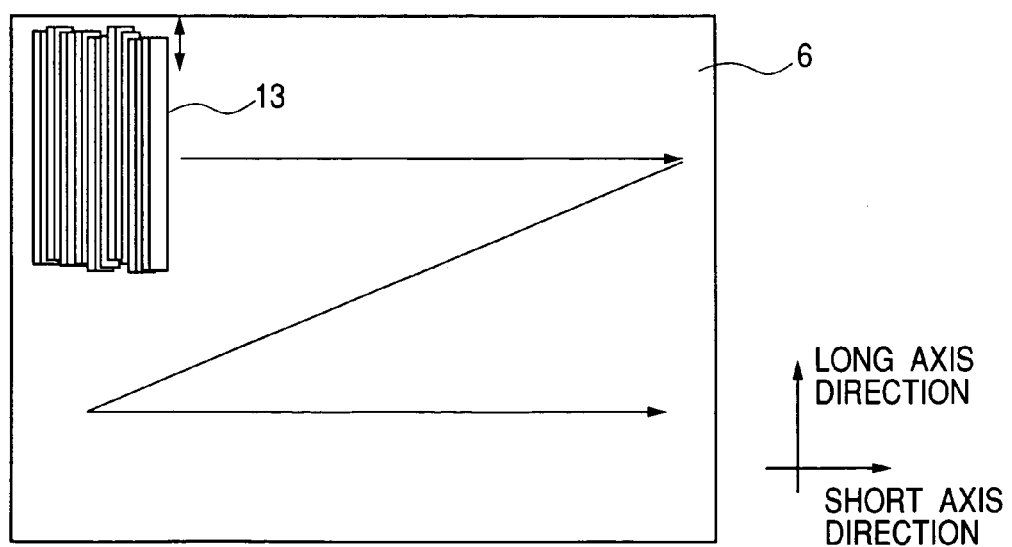
FIG. 3 is a schematic diagram of an exemplary scan of the laser beam in the manufacturing method of an active matrix substrate in accordance with the present invention.

Referring to FIG. 3, there is shown a schematic diagram illustrating an example of laser beam scanning method in a manufacturing method of an active matrix substrate in accordance with the present invention. In FIG. 3, there is shown an example of crystallization of entire surface of the glass substrate 6 that has approximately two times of the length of long axis of the laser beam 13. A laser beam of a line beam shape modulated in the long axis direction is moved at a constant velocity in the short axis direction of the laser beam 13 on the glass substrate 6 while displacing randomly in the long axis direction of the beam during exposure. By setting a smaller displacement distance between two laser pulses in the short axis direction than the laser beam width, an overlap between two exposure zones may be provided so as to irradiate the laser beam a plurality of times on the same area.

The number of exposure of the laser beam may be controlled by the displacement velocity toward the short axis direction. In FIG. 3, after having exposed the top half of the glass substrate 6, the bottom half thereof will be exposed in the same manner to obtain a substrate having entire surface crystallized. By arranging the irradiation area of the top half to be overlapped to the bottom half, a seamless crystallization can be obtained on the entire substrate. In this preferred embodiment, even when the position of exposure for the top half is moved with respect to the bottom half, the random displacement in the long axis Y direction will cancel the nonuniformity of crystallization, resulting in that there will be an advantage that no degradation of crystallization around the central part of substrate.

Figure 4:
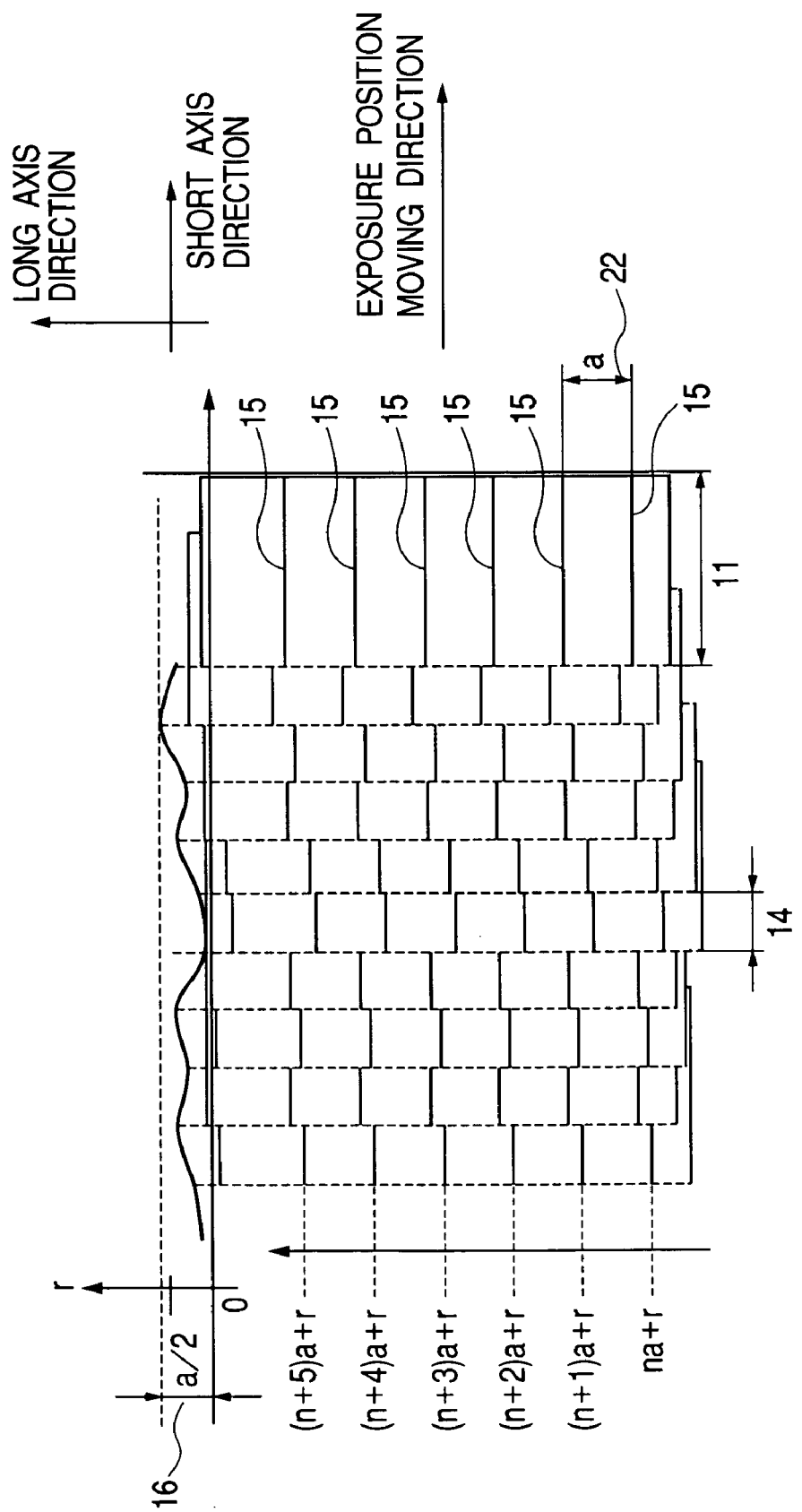
FIG. 4 is a schematic diagram of an exemplary laser beam intensity distribution and relationship relative to a substrate at the time of laser beam scan in the manufacturing method of an active matrix substrate in accordance with the present invention.

Referring to FIG. 4, there is shown a schematic diagram illustrating an example of positional relationships of the substrate in relative to the intensity distribution at the time of laser beam scanning in the manufacturing method of an active matrix substrate in accordance with the present invention. In this example a vertically elongate rectangular laser beam of FIG. 4 is modulated periodically in the long axis direction. Also in this figure there is shown an example of exposure by moving the laser beam in the right hand direction of the figure at a constant exposure interval 14. The position 15 at which the laser beam fluence is at maximum for each exposure is formed periodically in the long axis direction, the position in this long axis direction man be given by na+r, where n is an integer, laser beam modulation period 22 is a, a non-negative value smaller than a is r.

Since the maximum position 15 moves randomly in the long axis direction for each exposure, value r will accordingly be changed. If the value r is smaller than the period a, the exposure position will be substantially fixed, some area being irradiated by the laser beam of weak fluence, arising a problem that the cristallinity decreases. The fluctuating range 15 of the value r may be preferably at least a half of the period a or more.

Figure 5:
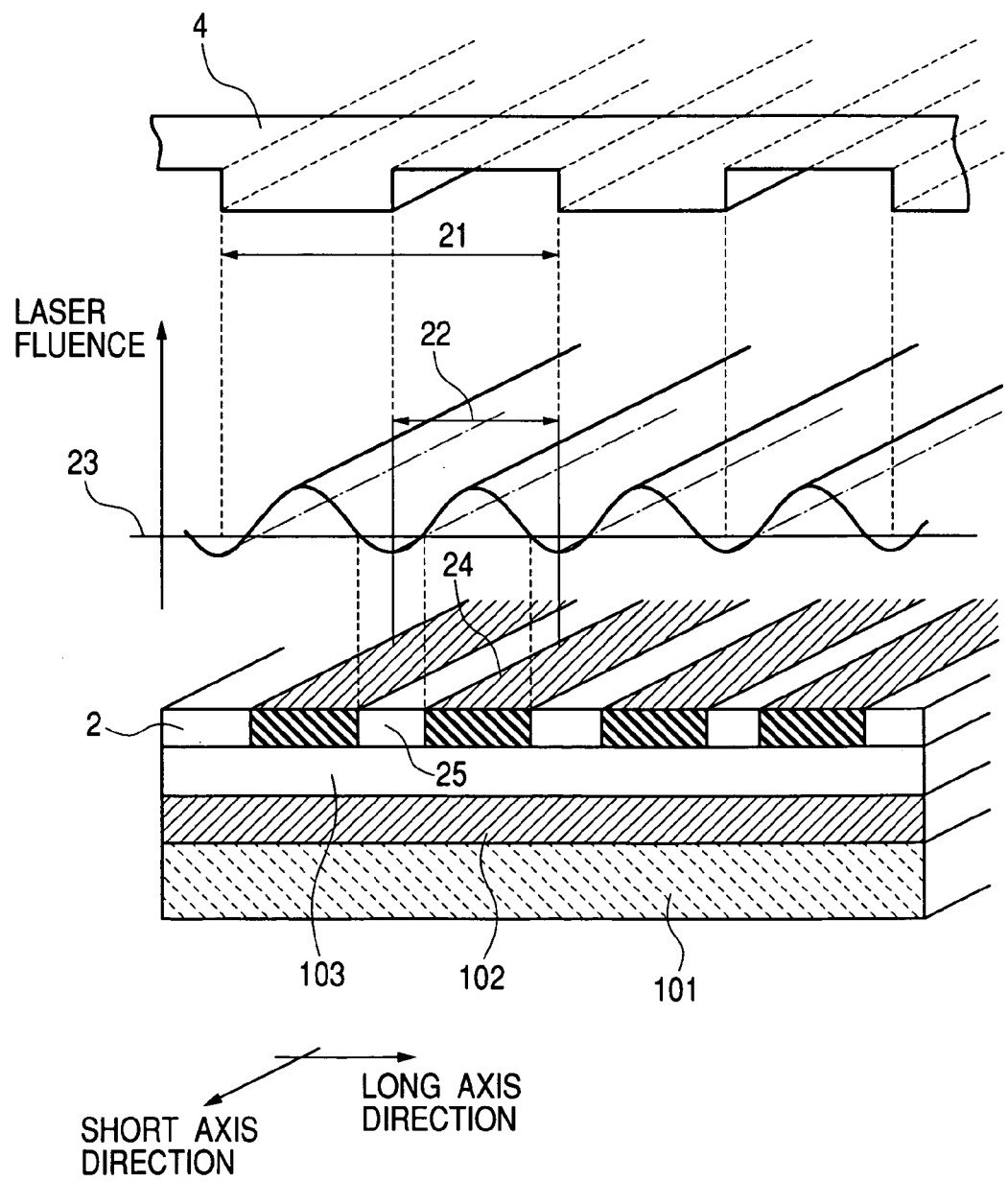
FIG. 5 is a schematic diagram illustrating the melting of semiconductor film formed on a dielectric substrate constituting an active matrix substrate at the time of exposure of pulsed laser beam.

Referring to FIG. 5, there is shown a schematic diagram illustrating the melting semiconductor film formed on a dielectric substrate constituting an active matrix substrate when exposed to a pulsed laser beam. The following description will refer to a glass substrate for the dielectric substrate constituting the active matrix substrate. On the glass substrate 101, undercoat films 102 and 103 made of SiN and SiO by the plasma CVD method, and an amorphous silicon semiconductor film 2 for the precursor are deposited at the thickness of 50 nm, 100 nm, and 50 nm, respectively. The amorphous silicon semiconductor film 2 are dehydrogenated by the annealing at 450 degrees, to avoid the development of defects caused by the hydrogen bumping at the time of laser beam exposure. A laser beam modulated after having transmitted through the phase shift mask 4 periodic to the long axis direction of the laser beam will be exposed thereon. The laser beam will be weakened at the step of the phase shift mask 4, and emphasized at other zones. The laser beam modulation period 21 will be a half of the step of the phase shift mask 4.

The amorphous silicon semiconductor film included in the zone 24 where the laser beam fluence exceeds beyond the melting threshold 23 will be completely melted in the film thickness direction. On the other hand, in the zone 25 where laser beam less than the melting threshold has been exposed amorphous silicon semiconductor film will be partially melted and crystallized to shift to polysilicon film. In the completely melted zone 24 crystal will laterally grow up in the long axis direction around the core of crystal of non-melted zone 25 in the vicinity. When setting the pulse width of the pulsed excimer laser beam to 25 nsec, the thickness of the amorphous silicon semiconductor film 2 to 50 nm, the maximum lateral growth distance at the room temperature will be approximately 1 µm. If the width of the completely melted zone 24 is more than twice of the maximum lateral growth distance, the center region of the completely melted zone 24 will be left ungrown from the lateral growth, and unpreferably microcrystalline will be formed. For example, if the step period 21 of the phase shift mask 4 is 3 µm, the modulation period 22 of the laser beam mask 4 is 1.5 µm, which is less than twice of the lateral growth distance of 1 µm, even when the width of completely melted zone 24 varies due to the fluctuation of laser beam fluence, microcrystalline development will be suppressed. This means an advantage of a wider margin with respect to the fluence fluctuation of the laser beam. In the following description, the width of the completely melted zone 24 will be described to be less than twice of the maximum lateral growth distance.

Figure 6:
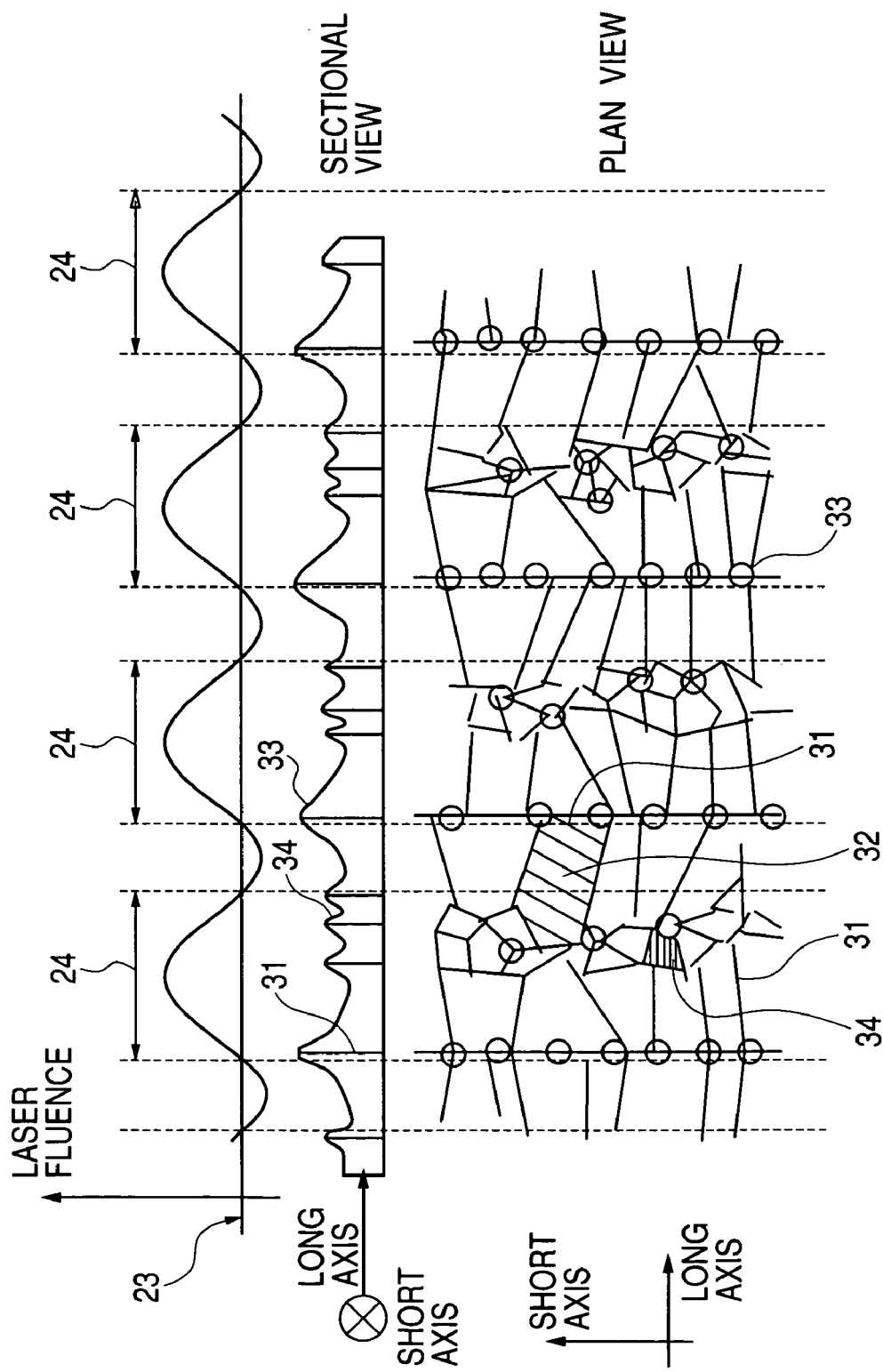
FIG. 6 is a cross sectional view and plan view of a silicon semiconductor film crystallized by exposing laser beam modulated by a phase shift mask to be again exposed by the laser beam modulated by the phase shift mask.

Referring to FIG. 6, there is shown a schematic diagram illustrating an example in a cross-section and plan view of a silicon film when the film has been crystallized by exposing with the laser beam modulated of intensity by a phase shift mask and is exposed by the laser beam modulated again by the phase shift mask. The silicon film shown in FIG. 6 is a polycrystalline film made of crystal grains 32, divided by the boundary 31 made by the previous exposure. The hillocks 33 along with the volume change at the time of solidification are formed at the same interval as the interval of laser beam. On the area that has been previously exposed by a laser beam of weak fluence, crystals 34 of relatively smaller grain size are formed. In this example, there is illustrated an exposure of the laser beam over the melting threshold 23 to the crystal grain of relatively small size. The similar components or meaning to FIG. 5 are designated to the identical reference numbers.

Figure 7:
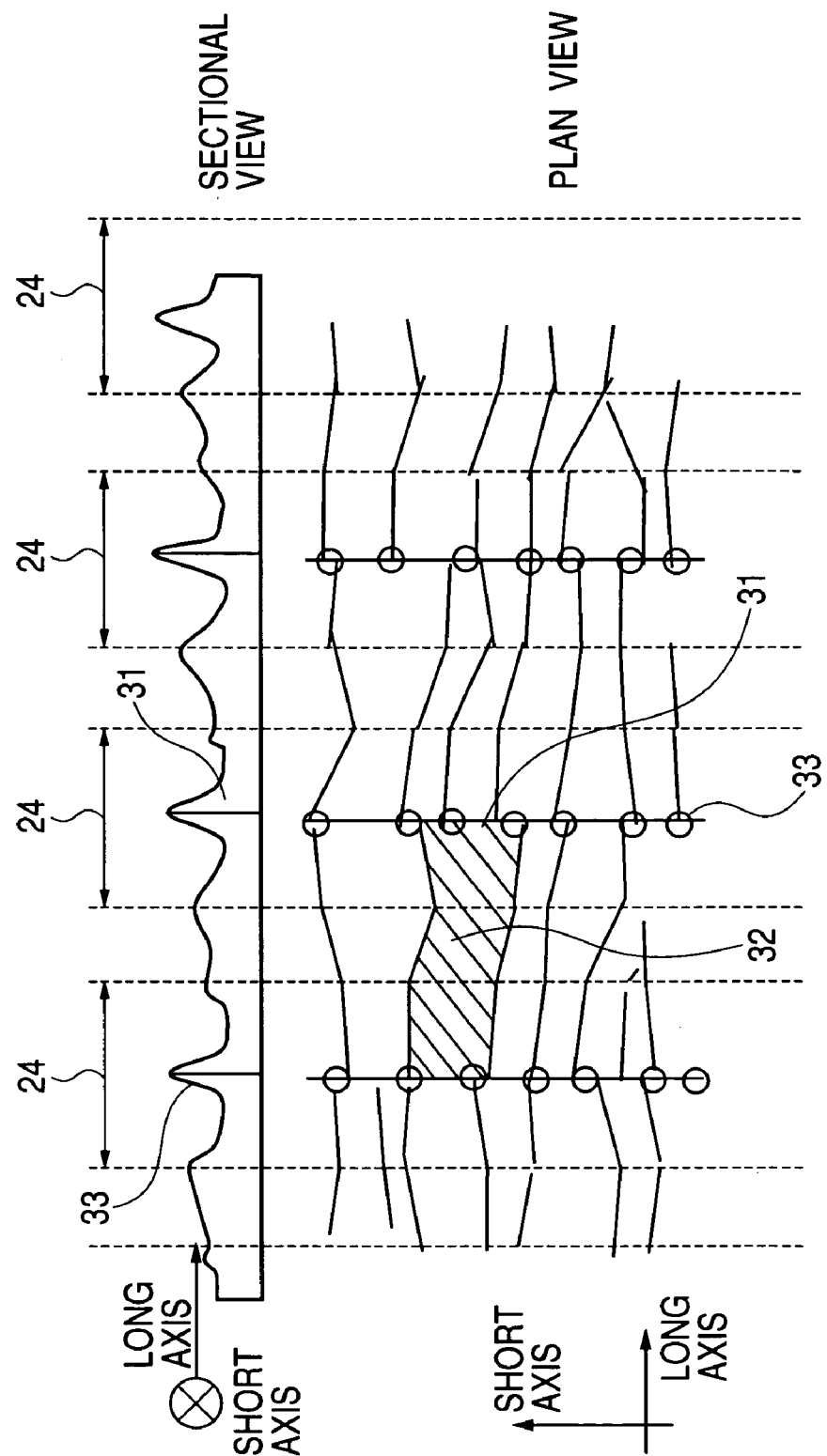
FIG. 7 is a cross sectional view and plan view of a crystal after exposing laser beam in the arrangement illustrated in FIG. 6.

FIG. 7 shows a schematic diagram illustrating a cross sectional view and a plan view of crystals after exposing to the laser beam in the same arrangement as FIG. 6. The similar members are designated to the identical reference numbers to FIG. 6. The crystals included in the zone 24 exposed to the laser beam of more than melting threshold 23 in FIG. 6 will be melted, and crystals in the same orientation as those at the edge of the completely melted zone 24 will grow laterally to form a polysilicon film 32 as shown in FIG. 7. The crystals at the both edges of the completely melted zone 24 will have different crystal orientations in general, new crystal grain boundary 31 will be formed at the center of the completely melted zone 24 of FIG. 7. On the center of the melted zone new hillocks 33 created is shown in FIG. 7. In this embodiment, the crystals in the zone not included in the completely melted zone 24 will grow laterally to form crystal grains 32 having approximately same length as the modulation period of the laser beam, so that the polysilicon film will have the grain in the in the long axis direction of the entire film almost matched to the modulation period of the laser beam.

Then by iteratively repeating the exposure of the laser beam while at the same time moving randomly in the long axis direction, the melted zone 24 at each exposure will move randomly. On the zone on which the laser beam has been irradiated, lateral growth will develop to increase the grain size in the long axis direction, eventually as shown in FIG. 7, the grain size will become to the same length to the modulation frequency of the laser beam. In addition, to obtain a good crystallization result, it is important that the grain size may not be shrunk in the succeeding exposure after the primary formation of crystals of the length the same as the period.

Figure 8:
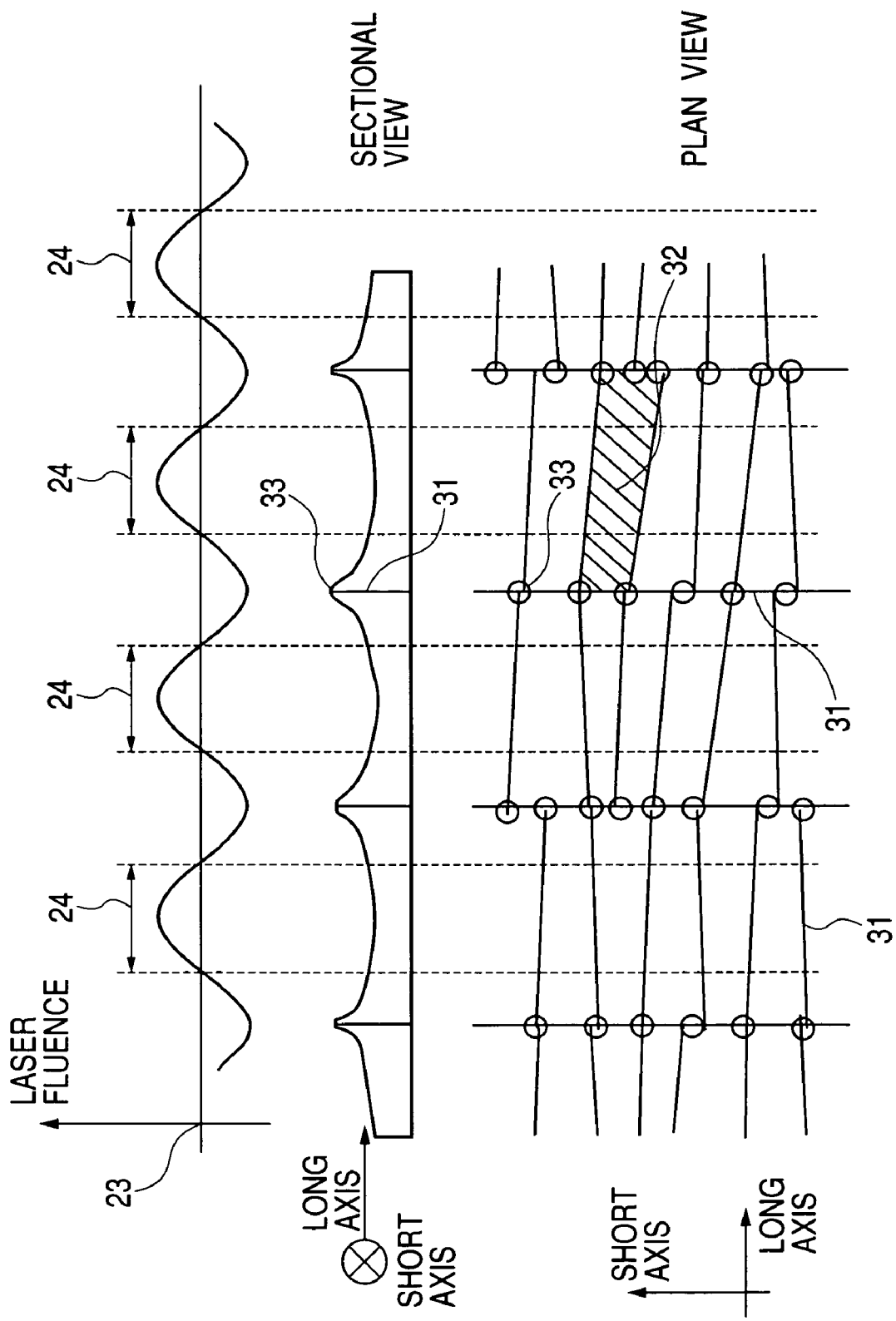
FIG. 8 is a schematic diagram of an exemplary crystal prior to exposing laser beam over the melting threshold, to a polysilicon film having a grain size similar to the periodicity in long axis direction, so as to divide a single crystal grain not including grain boundary.
Figure 9:
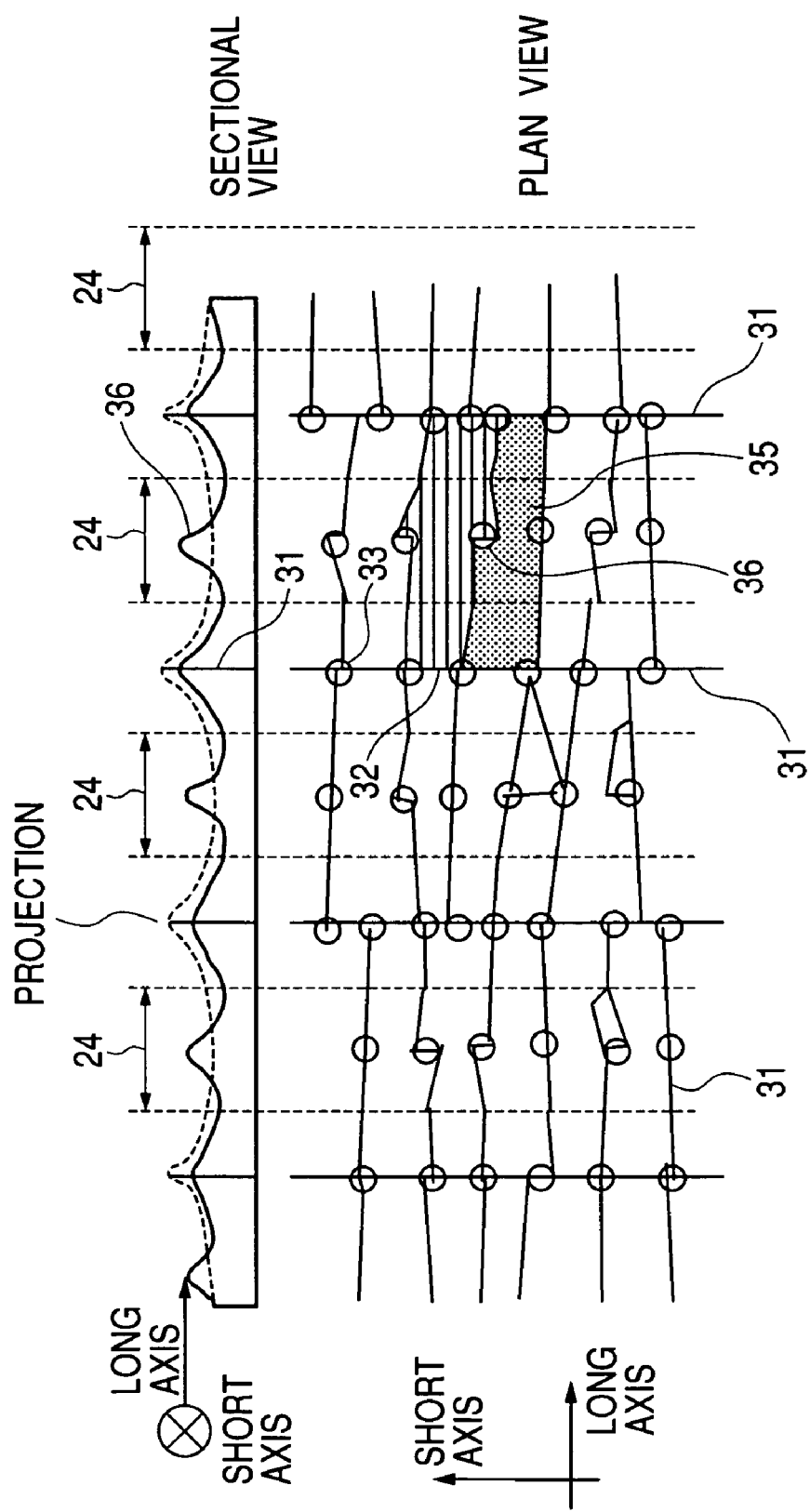
FIG. 9 is a schematic diagram of an exemplary crystal after exposing laser beam over the melting threshold, to a polysilicon film having a grain size similar to the periodicity in long axis direction, so as to divide a single crystal grain not including grain boundary.

Referring to FIG. 8, there is shown an example of crystals prior to the laser beam exposure of the energy over the melting threshold to the polycrystalline silicon film having the grain size in the long axis direction approximately as large as the period in such a manner as a single crystal grain 32 not including the boundary is divided; FIG. 9 shows an example of crystals after the laser beam exposure of the energy over the melting threshold to the polysilicon film having the grain size approximately same as the period in such a manner as a single crystal grain 32 not including the boundary is divided. Crystals before the laser beam exposure has periodic hillocks 33 formed as shown in FIG. 8, and boundary 31 formed along with the hillocks 33. The crystals in the melted zone 24 will be melted by the laser beam exposure, however the crystals at both sides are derived from one single crystal and their orientation are the same so that the orientation of crystal after lateral growth will be the same.

After laser beam exposure, as shown in FIG. 9, laterally grown crystals in the center of the melted zone 24 will be fused to each other to form again one single crystal 32. New hillocks 36 will be also formed around the center of the melted zone 24, along with the increased volume. The hillocks by the laser annealing are likely to be formed on the intersection of three or more crystals, and more than two boundaries will be crossed over. On the other hand, as shown in the figure, the boundaries intersecting to the hillocks 36 of the semiconductor film of FIG. 9 is characterized in that it includes hillocks including only one boundary in the shape of letter Z. Since the width of crystals grown from both sides of the melted zone 24 is not the same, new boundary can appear around the center of the melted zone, however most of the crystals grown from both sides will be fused without forming a new boundary, and thus a film having a grain size with its length almost identical to the modulation period of the laser beam. Once the crystal grains formed with the length almost identical to the modulation period of the laser beam, the grain size after the succeeding laser beam exposure will be approximately constant. As a result, in accordance with the preferred embodiment, the crystal grains of the length almost identical to the modulation period will be eventually formed in a high probability by a plurality of times of laser beam exposure.

In the crystallization method of a silicon semiconductor film in accordance with the preferred embodiment, if there is a registration error between laser beam exposures, the error will be absorbed by the random displacement added to the period direction of the laser beam modulation and canceled out. Therefore, the scanning error of the stage carrying the substrate may be even larger than the lateral growth distance; so that a simple stage scanning mechanism can be used to decrease the installation cost. Also, the exposure number of laser beam may be set such that on an average each zone will be melted once. In this embodiment for example ten exposures will form a crystal having the grain size in the period direction of the modulation of laser beam, i.e., 1.5 μm. In comparison to the conventional multi-shot procedures of the prior art, which requires tens of exposures for forming a similar crystal grain, the method in accordance with the present invention needs only a fraction of exposures, resulting in a higher throughput.

The grain size of crystals can be determined by the modulation period of a laser beam. Thus, almost the same size of crystal grains can be obtained even when the lateral growth distance is different and a larger margin to the laser beam fluence may be yielded. Also in the present invention entire film zone is not needed to be melted at once. Rather it is sufficient to emit the laser beam having a fluence beyond the melting threshold. This permits to having a lesser mean fluence. In the modulation by the phase shift mask, the mean intensity before and after the modulation is identical except for the loss by the reflex at the mask, therefore laser output required to process can be further decreased, in comparison to the conventional methods. When using a laser of the same oscillation power, a wider area can be treated at once, resulting in an improved throughput.

In accordance with the preferred embodiment, the displacement of the position of laser beam exposure into the modulation period direction requires a given zone to be emitted at a fluence beyond the melting threshold at least once. However the melted zone may or may not be overlapped between two successive laser beam exposures. When the exposure position of laser beam is random each time, the probability that there remains an area to which is never irradiated the laser beam of the fluence over the melting threshold value for a plurality of exposures, will decrease exponentially with respect to the number of exposures. When the modulation period of the laser beam is set to be less than twice of the lateral growth distance and the width of area to irradiate at a fluence over the melting threshold value is a half of the period, then crystal as approximately same as the period will be yielded with a number of shots as less as five, the throughput will be preferably improved.

In accordance with the preferred embodiment, the positional change of laser beam modulation toward the period direction may not be needed to be quite random, but it is sufficient that the laser beam of the fluence over the melting threshold be emitted to every point on the silicon semiconductor film (Si film). For example, the moving distance of the laser beam toward the modulation period direction can be set not to be constant, so as to include a distance larger than a half of the period among shots. Also the laser beam can be oscillated at an amplitude larger than the modulation period of the laser beam, at a period different from the integer of the number of shots. A good result can be yielded only if every point on the Si film are emitted once or twice irrespective of the sequence. For example, it can be conceivable that the displacement direction in the period direction is reversed once or twice for every a few shots. Also, the grain size of thus obtained crystals is not depended on the starting point of exposure so that no registration is necessary, and it can be quite possible to crystallize again a substrate of insufficient crystallization to recover.

In the above-described embodiment, pulsed laser beam has been used, however a CW laser beam may also be used. In case of CW laser, the lateral growth position will move along with the displacement of the exposure point toward the modulation period direction, and the similar result to the pulsed laser beam can be obtained. In addition the wavelength of laser beam may not be limited to 308 nm, any other wavelengths can be used, provided that the beam is absorbed by the Si semiconductor film to develop heat and that the phase shift mask is available, which is transparent and durable to the laser beam exposure. For example the excimer laser of the wavelength of 248 nm can be used along with a phase shift mask made of quartz. A CW laser of 532 nm of wavelength may be used in combination with a phase shift mask formed by a transparent plastic. A plastic mask may be obtained in an inexpensive way by mold forming. Since the plastic mask is superior shock resistant one, of which a thinner and lightweight mask can be made, which allows speeding up the movement to the above described period direction. The manufacturing method of a polysilicon film in accordance with the preferred embodiment can be used when the interference of laser beam is not sufficiently high.

Figure 10:
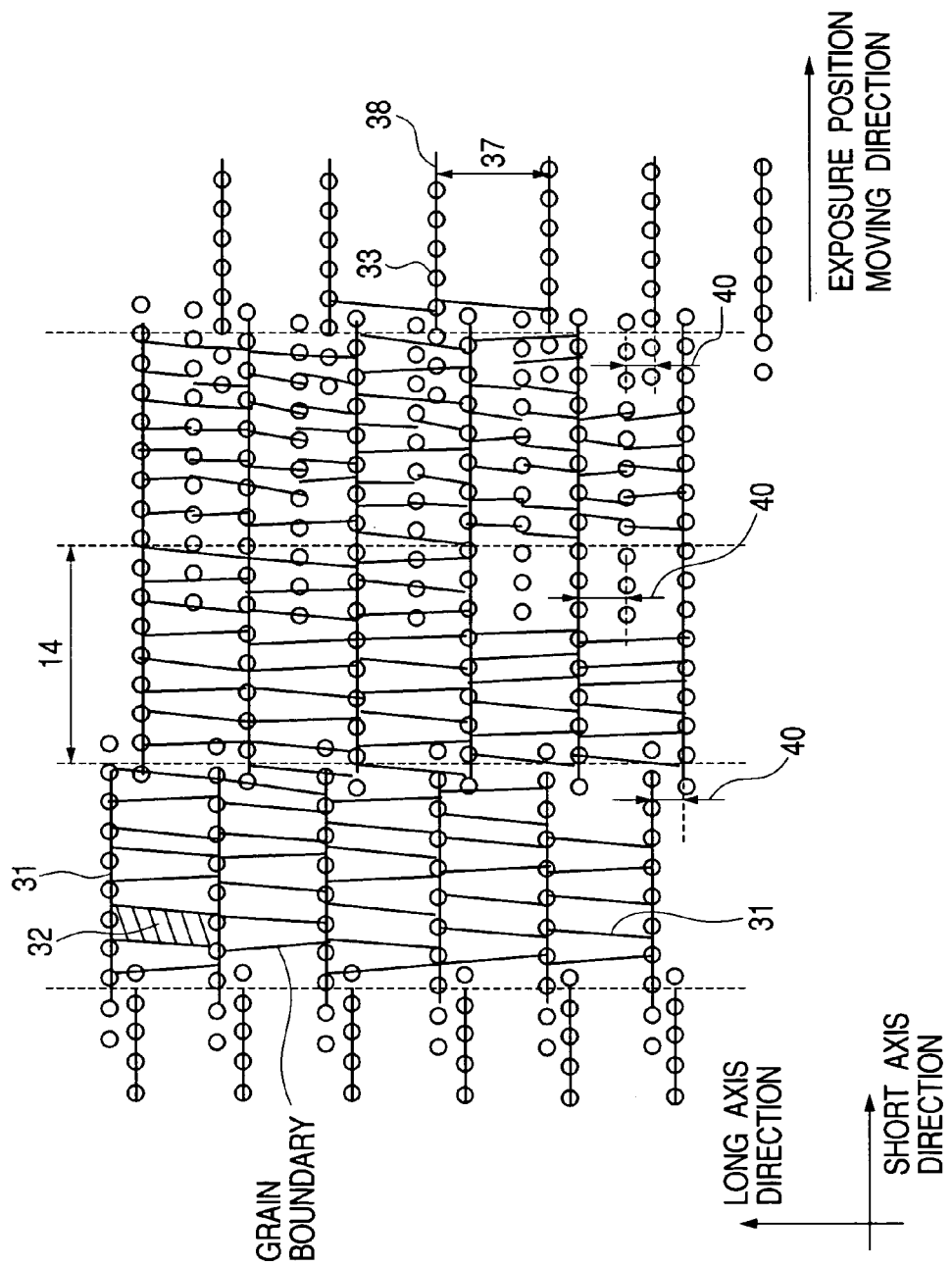
FIG. 10 is a schematic diagram illustrating the arrangement of grain boundary and hillocks of polycrystalline semiconductor film formed in accordance with the preferred embodiment of the present invention.

Referring to FIG. 10, there is shown a schematic diagram illustrating the positioning of boundary and hillocks of polysilicon semiconductor film formed in accordance with the preferred embodiment of the present invention. In FIG. 10, a laser beam of the shape of very thin rectangle in the vertical direction of the figure in combination with a phase shift mask periodic in the long axis direction is used to modulate the laser beam to sequentially scan from left hand side to right hand side of the figure to form a polysilicon semiconductor film. While moving horizontally, that is in the short axis direction, the exposure point of the laser beam by an exposure interval 14 for every pulse emission of laser beam, the laser beam will be randomly moved in the long axis direction. The exposure interval 14 may be smaller than the width of short axis of the laser beam (not shown in the figure), and every point of the semiconductor film will receive a plurality of number of laser beam exposures.

For the semiconductor film, the hillocks 33 corresponding to the melted zone at the exposure of laser beam will be formed as a linear array of hillocks 38. The period 37 of the array of hillocks 38 is identical to the modulation period of laser beam. Since the displacement of laser beam toward the period direction is random, the position to which the hillock array will be formed will also be random, resulting in a random error 40 of the array of hillocks for every exposure interval 14. The hillocks in a zone that receives a fluence larger than the melting threshold will be melted, however hillocks of any other zone will remain intact. As the width of melted zone may be smaller than the period, in most cases arrays of hillocks not included in the melted zone of the last laser beam exposure. Therefore other than the array of hillocks formed at the last laser beam exposure, there will remain other arrays of hillocks in the same period. This results in a plurality of arrays of hillocks in one period.

After crystal grains of the length almost same as the period is formed, when a laser beam of the fluence larger than the melting threshold at the position of dividing the grain is emitted to reform a single crystal, as shown in FIG. 9, an array of hillocks with only one intersecting boundary will be formed. The semiconductor film crystallized by the random displacement of modulated position in accordance with the preferred embodiment may have such a feature.

When the fluence of laser beam is low and melted zone width is smaller than the modulation period of the laser beam, the array of hillocks as described above may be likely to remain, and more arrays of hillocks in the period tend to be created. The hillock closer than a half of the width of the melted zone may be fused together, the minimum distance between hillock arrays may be approximately equal to a half of the lateral growth distance of the last laser beam shot. For a film having a plurality of hillock arrays formed thereon, the hillock height tends to be lowered due to the increased volume because the lateral growth distance is small, such film is more preferable to be used as thin film transistor channel. When increasing the fluence of laser beam in the first half exposure to form crystal grains of the length approximately equal to the period with fewer number of shots with large width of melted zone, then decreasing the fluence of laser beam in the second half exposure to narrow the width of melted zone, a plurality of hillock arrays can be made without making new boundary so as to decrease overall roughness, resulting in a semiconductor film suitable to be used as thin film transistor channel.

By preparing a fluence gradient such that the second half of exposure fluence is decreased in comparison with the first half of laser beam exposure fluence in the short axis direction, a similar effect can be obtained. By enlarging the modulation period of the laser beam in the first half of the laser beam exposure and shrinking the modulation period in the second half, a film having larger grain size corresponding to the modulation period of the laser beam of first half, and smaller mean interval of hillock arrays corresponding to the modulation period of the laser beam of second half, that is, the film having smaller roughness can be obtained.

Figure 11:
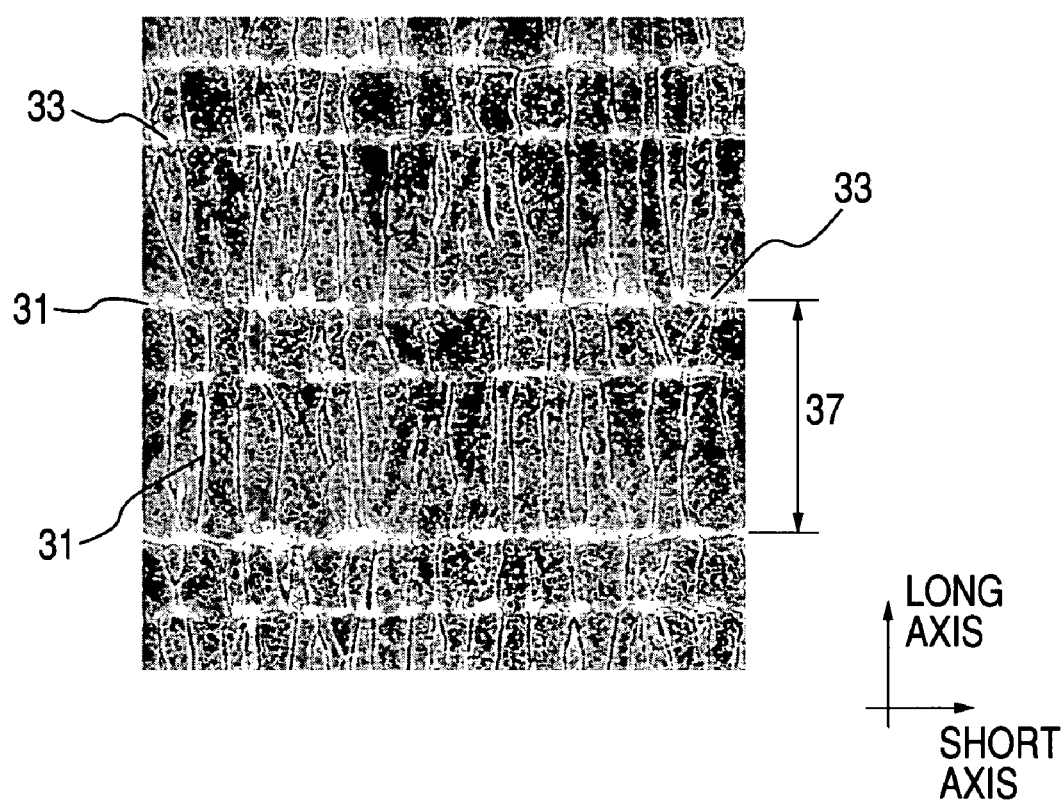
FIG. 11 is a microscopic photograph illustrating an exemplary silicon semiconductor film obtained in accordance with a manufacturing method of the present invention.

Referring to FIG. 11, there is shown a microscope photograph illustrating an exemplary Si film obtained by using the manufacturing method of the present invention. The polysilicon film shown in FIG. 11 is consisted of a glass substrate, an undercoat film, and an amorphous Si film of 50 nm formed thereon, the amorphous Si film was then dehydrogenated and crystallized in accordance with the manufacturing method as above. The crystallization was done by means of pulsed excimer laser beam modulated in the long axis direction with the width of 360 µm in the short axis direction and the width of 365 millimeters in the long axis direction. Using a phase shift mask of 3-µm pitch, the laser beam was modulated to 1.5-µm period. The exposure point was scanned from the left to right of FIG. 11, while randomly moved in the long axis direction. 10 shots of exposure were performed by setting fluence prior to shaping to a line beam to 800 mj, and the displacement between exposing laser pulses in the short axis direction of the exposure point to 36 µm. Thus obtained film was selectively etched the boundary by using the Wright etcher, then observed on a scanning electron microscope (SEM). In FIG. 11 a film thicker than the circumference was deposited on much brighter area, and hillocks 33 were formed.

Figure 12:
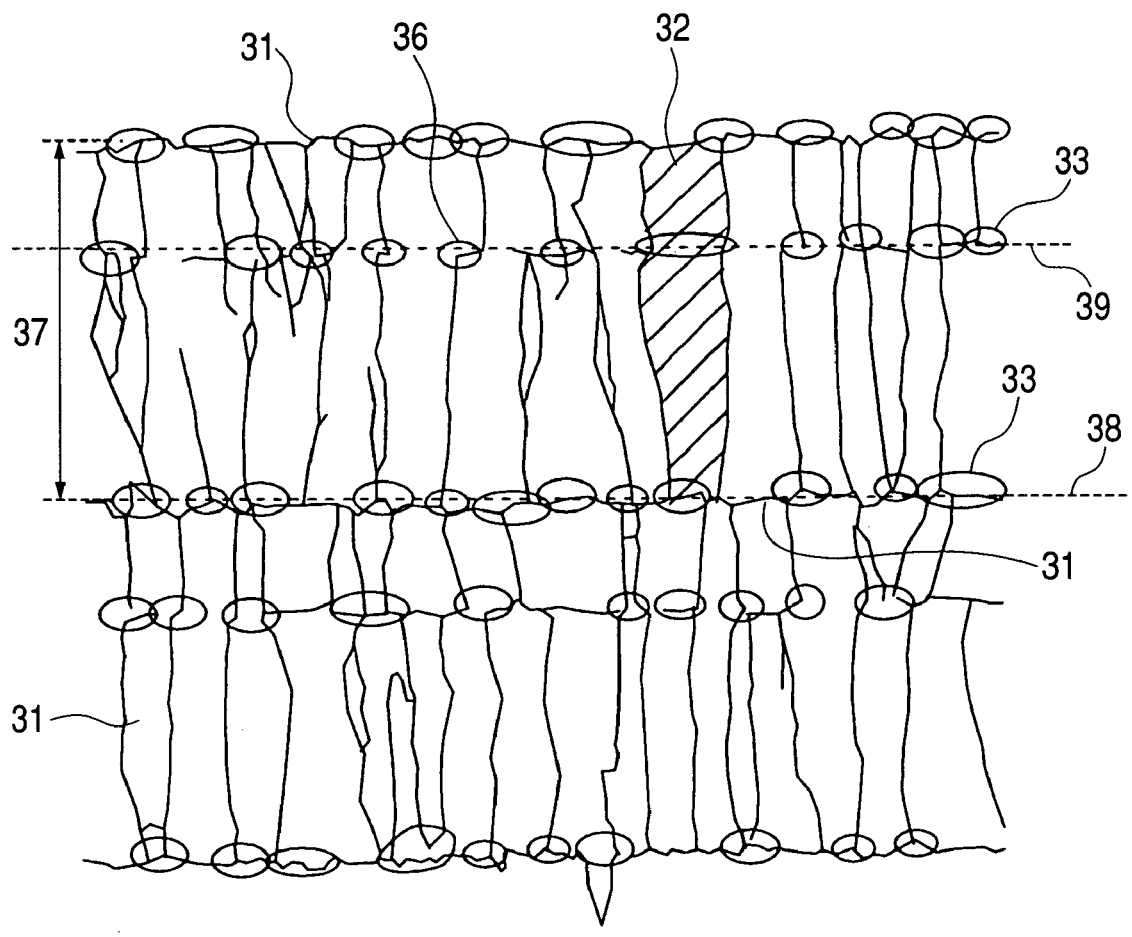
FIG. 12 is a schematic sketch of boundaries and hillocks of the photograph shown in FIG. 11.

Referring to FIG. 12, there is shown a schematic sketch of boundarys and hillocks of FIG. 11. The periphery 37 of the array of hillocks 38 linearly formed in FIG. 12 is 1.5 µm, matched to the modulation period of the laser beam. A crystal grain 32 of the length almost equal to the period direction is formed as shown by shaded area. In a period another hillock array 39 is created, other than the array of hillocks 38 almost matched to the boundary. The hillocks of the hillock array 39 include a hillock 36 having only one boundary.

Figure 13:
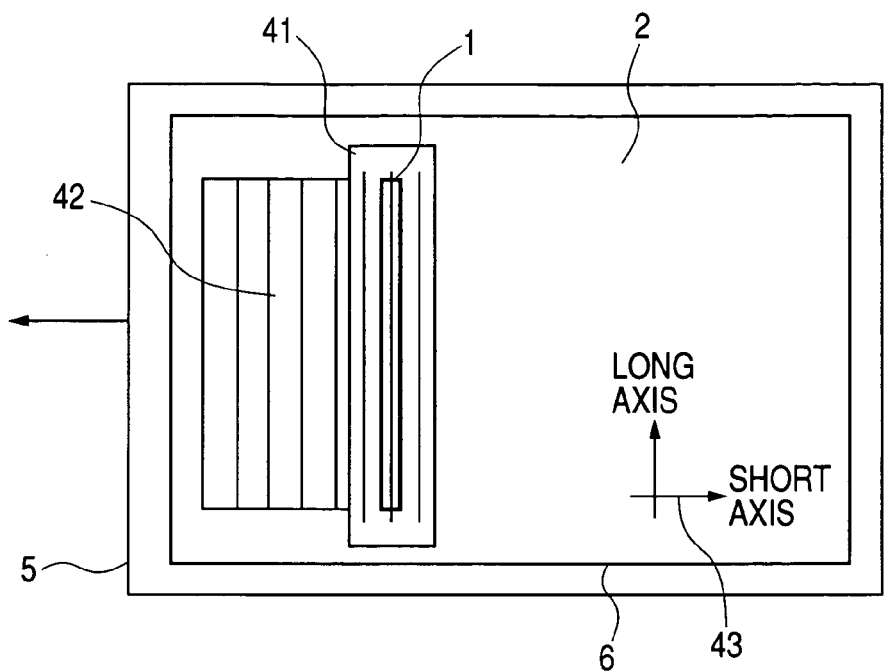
FIG. 13 is a schematic diagram illustrating an example of process steps of manufacturing a semiconductor film by exposure of laser beams each having different periodicity.
Figure 14:
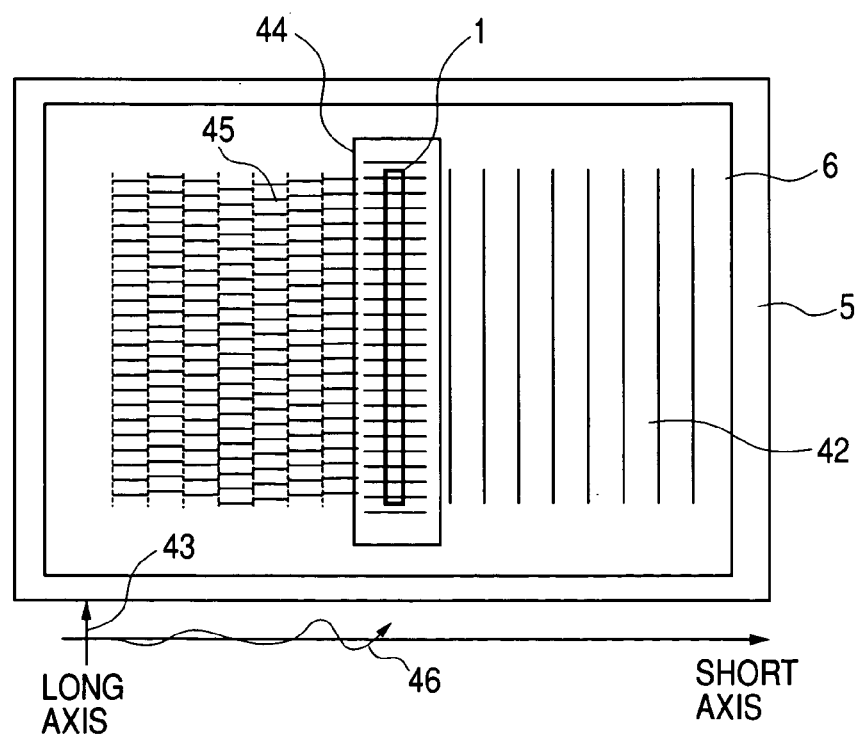
FIG. 14 is a schematic diagram illustrating another example of process steps of manufacturing a semiconductor film by exposure of laser beams each having different periodicity.

Referring to FIG. 13 and FIG. 14, there are shown schematic diagrams of process steps for manufacturing semiconductor films by exposing laser beams each having a different periodicity. In FIG. 13, the laser beam will pass through a phase shift mask 41 having a linear pattern of period of 8 µm in the short axis direction of the linear shaped laser beam 1. The phase shift mask 41 is held at the level of 0.7 millimeter above the substrate, which creates laser beam having a periodic intensity distribution in the short axis direction of 4-µm period. The fluence of the laser beam may be set such that the width of exposure zone of laser beam that exceeds the melting threshold of polysilicon film will be less than twice of the maximum lateral growth distance, for example 1 µm when the maximum lateral growth distance is 1 µm.

The stage 5 carrying the glass substrate 6 may be scanned in the short axis direction during exposure, such that the laser beam of fluence over the melting threshold is irradiated more than once on every area of the substrate. By setting the beam width to 330 µm, displacement of 33 µm in the short axis direction for each exposure, 10 shots of laser beam were exposed to the substrate having an amorphous Si film 2 formed. The width of area exceeding the melting threshold in this preferred embodiment is approximately a quarter of the laser beam modulation period, each area will be melted more than once by those 10 shots. On the crystal grains of the polysilicon film 42 after exposure the crystal grains will be in the form of lateral growth in the short axis direction which is the direction of intensity modulation 43 of the laser beam, and will have the mean grain size of approximately 1 μm in the short axis direction, which size corresponds to the lateral growth distance.

When modulating the laser beam 1 using a phase shift mask 41 with a periodicity in the short axis direction as is the present embodiment, the diffracted light in the short axis direction will escape out of the line shaped laser beam to introduce some loss. This loss will be larger when the pitch of phase shift mask 41 becomes smaller, and if the distance from the phase shift mask to the substrate is larger. The distance between the glass substrate 6 and the phase shift mask 41 is required to be more than 0.2 millimeter, in the standpoint of preventing any debris onto the phase shift mask 41, and the distance may not be too closer. Therefore in order to avoid the loss, for the phase shift mask 41 with a period in the short axis direction, it is preferable that the period be larger than the phase shift mask of the period in the long axis direction. The diffraction loss may be suppressed below 10%, a practical level, if the phase shift mask is pitched to more than 6 μm for the laser beam shape and the phase shift mask height of the preferred embodiment.

To suppress microcrystalline, the width of area exceeding the melting threshold will be limited to the maximum lateral growth distance. When the modulation period of laser beam becomes larger, then the range of lateral growth in the exposure region of the laser beam will be narrowed and the number of exposure necessary to obtain a good crystallization will increase. In order to allow lateral growth of the entire surface in about 10 shots, the modulation period of the laser beam needs to be limited to 5 times the maximum lateral growth distance. In the present embodiment, for example 5 μm or less of laser beam period, entire surface may be laterally grown by about 10 shots.

In FIG. 14, similarly to FIG. 1, laser beam 1 incident to a phase shift mask 44 with a periodicity in the short axis direction is shaped to have a periodicity in the long axis direction, which is then emitted to a polysilicon film obtained by the method according to FIG. 13. By irradiation of the laser beam while moving the stage 5 carrying the glass substrate 6 in the short axis direction at a predetermined velocity and giving a random displacement 46 in the long axis direction, a polysilicon film 45 having the crystal grains of the length approximately equal to the modulation period of the laser beam in the long axis direction may be obtained. In the polysilicon film 45, the grain size in the direction perpendicular to the growth direction, i.e., in the short axis direction, may vary depending on the crystalline of the polysilicon film 42, the grain size will become large in comparison with the direct exposure to the amorphous silicon film, resulting in a film with anisotropy decreased.

Figure 15:
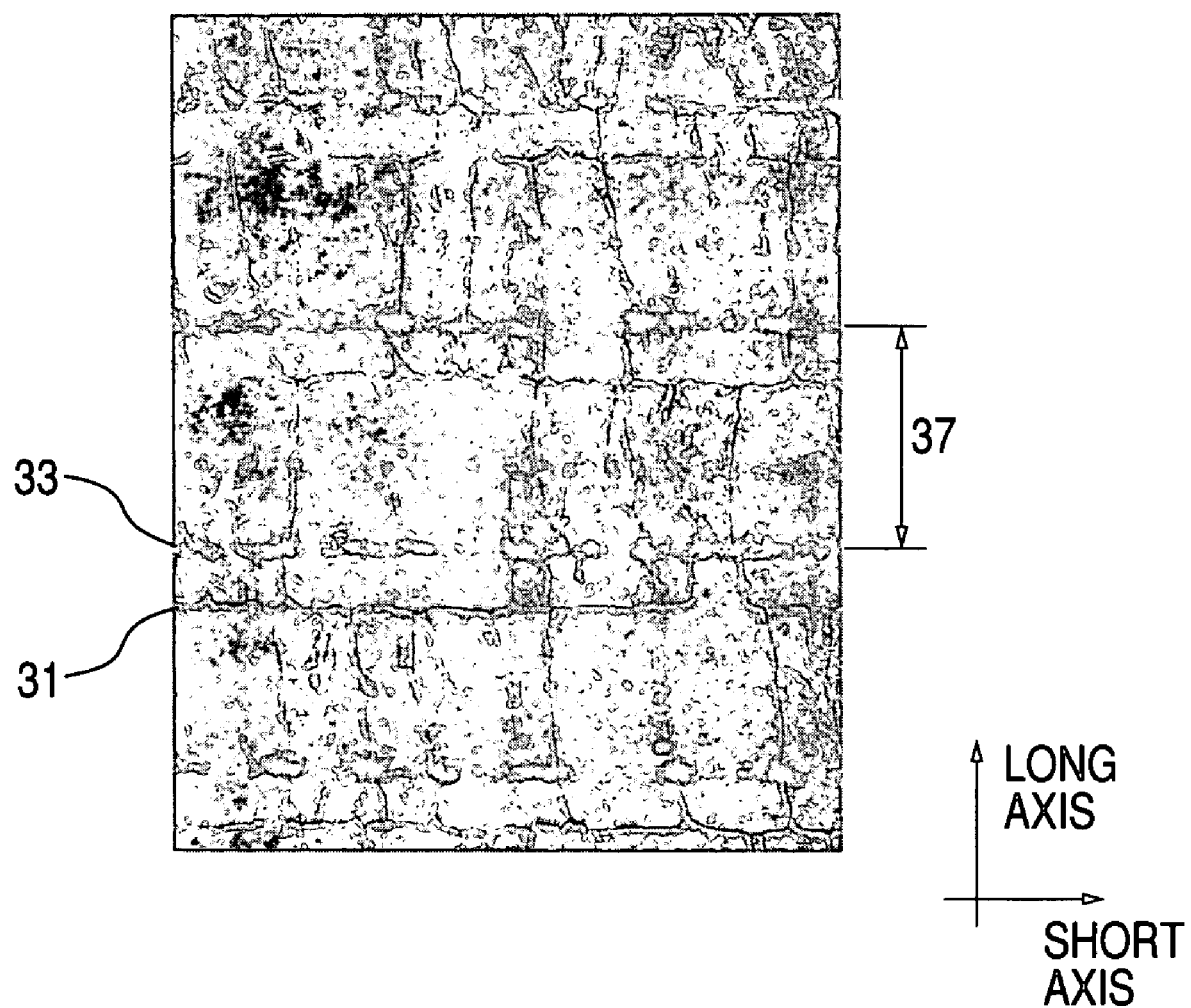
FIG. 15 is a microscopic photograph illustrating an exemplary silicon semiconductor film formed by sequential exposure of laser beams each having a periodicity in perpendicular directions, in accordance with another preferred embodiment of manufacturing method of the present invention.

Referring to FIG. 15, there is shown a microscopic photograph illustrating an exemplary Si film formed by sequentially exposing the laser beams each having the periodicity in the perpendicular direction each to other in another embodiment of the manufacturing method in accordance with the present invention. In this example a phase shift mask of 10-μm pitch is used to modulate the laser beam in the short axis direction of the beam, and 10 shots are exposed. Then the laser beam is modulated in the long axis direction of the beam by using a phase shift mask of 3 μm pitch to expose 10 shots to crystallize. The latter crystallization was performed, by moving the substrate at a random distance for each shot, in the direction of modulation period of the laser beam, i.e., in the long axis direction. FIG. 15 shows a semiconductor film thus obtained, etched with Wright etcher for eliciting the boundary, and observed by a scanning electron microscope (SEM).

Figure 16:
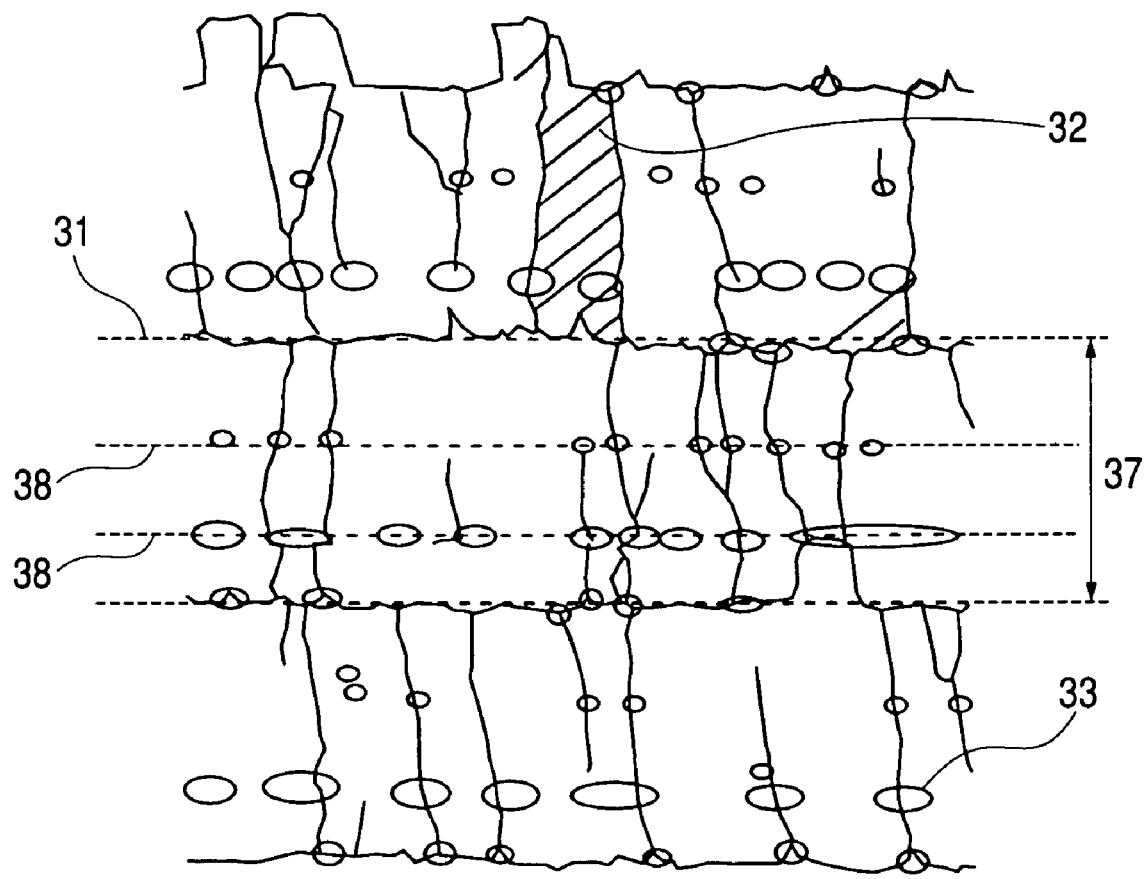
FIG. 16 is a schematic sketch of boundaries and hillocks of the photograph shown in FIG. 15.

Referring to FIG. 16, there is shown a schematic diagram depicting the boundary and hillocks of the photograph in FIG. 15. In FIG. 16, the hillocks 33 are formed at an interval of 1.5 μm, which is almost corresponding to the modulation period of the laser beam of period in the long axis direction exposed in the second half. Also plural arrays of hillocks 38 are formed in the period with the hillocks arranged linearly. The grain size perpendicular to the period is larger than that described with reference to FIGS. 11 and 12, corresponding to the lateral growth of crystallization by the laser beam of a first half, which is periodic in the short axis direction. The grain size was approximately 0.3 μm in FIGS. 11 and 12, and approximately 0.5 μm in average in this example, with decreased anisotropy. The hillock arrays in parallel to the long axis direction formed by the lateral growth in the short axis direction are disappeared here due to the second exposure, with no new roughness present with respect to the embodiment described in FIGS. 11 and 12.

The present embodiment may be implemented by means of a single apparatus by adding a phase shift mask switching mechanism in the course of manufacturing process, without difficulties, with a lower implementation cost. A similar effect of decreased anisotropy may be yielded, by modulating the laser beam using only a mask of periodicity in the long axis direction, scanning the substrate in the short axis direction while moving randomly in the long axis direction, and turning the substrate 90 degrees during the crystallization by the laser beam exposure, and continuing the exposure. In this case a mechanism for turning the substrate 90 degrees at the time of carrying in the stage or substrate is required, which implies a slight increase of installation cost, however crystals with anisotropy more decreased and approximately same grain size in both long and short axis directions. In this method the hillocks formed in the first half will be almost disappeared, except that mild hillocks will be remained by the laser beam exposure after a rotation of 90 degrees, and the hillock arrays having the roughness in the rotated direction approximately equal to the exposure without rotation of 90 degrees will be formed, so that there will be no increase of roughness.

Figure 17:
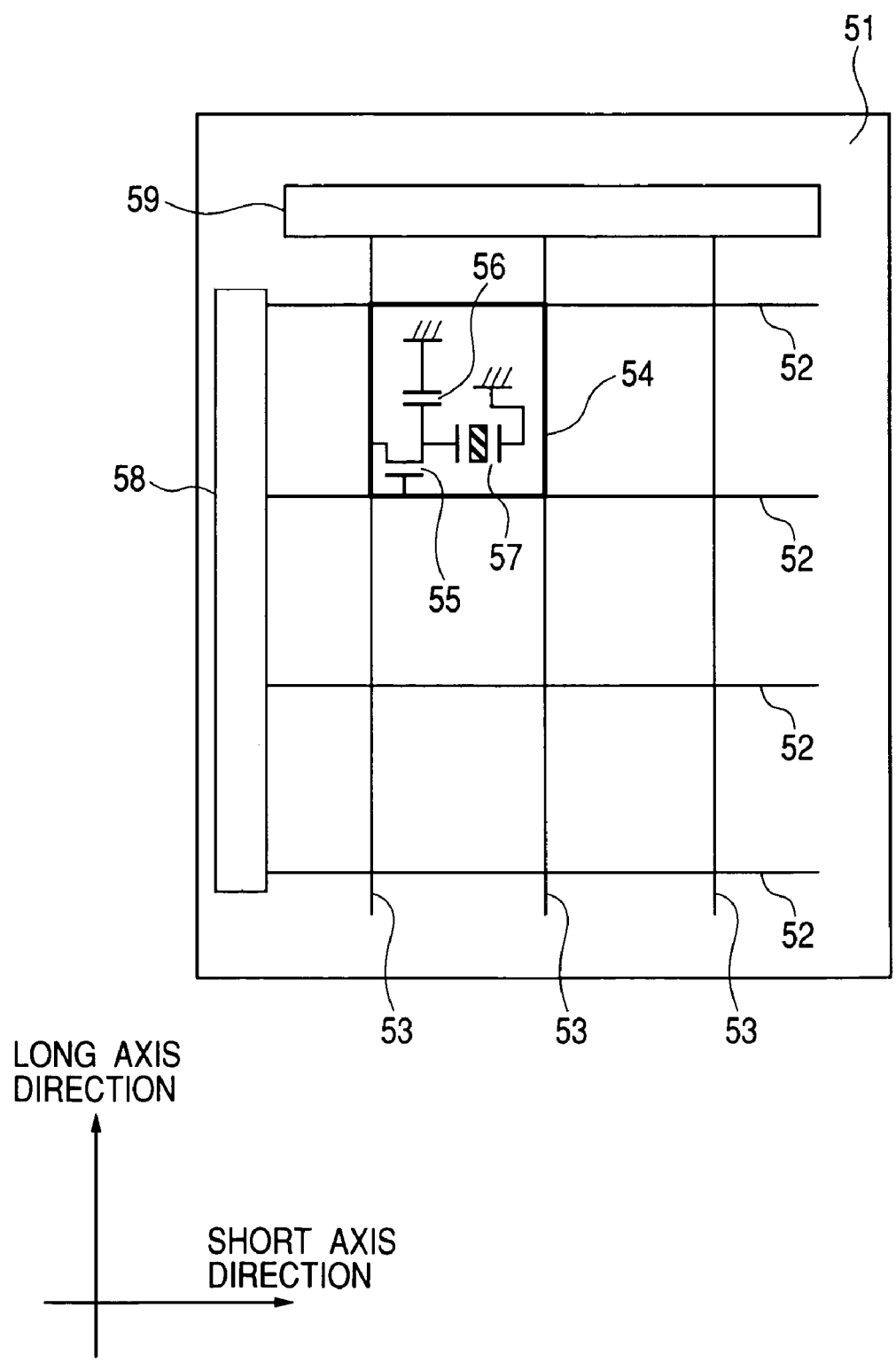
FIG. 17 is a plan view illustrating another embodiment of circuit design on an active matrix substrate for a liquid crystal display device having thin film transistors formed on a polycrystallized semiconductor film in accordance with the manufacturing method of the present invention.

Referring to FIG. 17, there is shown a schematic plan view illustrating an exemplary circuitry on an active matrix substrate for an liquid crystal image display device having thin film transistors formed on the polycrystallized semiconductor film in accordance with the manufacturing method of the present invention. The liquid crystal display device includes an active matrix substrate 51 having thin film transistors formed thereon, and a liquid crystal 57 sealed between the substrate 51 and an opposing substrate not shown in the figure. The active matrix substrate 51 having thin film transistors formed thereon is a transparent dielectric substrate (glass substrate) made of glass, a plurality of wirings (gate lines 52 and data lines 53) intersecting each other placed thereon.

At an intersection of a gate line 52 and a data line 53, a pixel circuit 54 is formed for driving the liquid crystal 57. The pixel circuit 54 includes a pixel switch 55 composed of a thin film transistor served as a switch, and a storage capacitor 56. The thin film transistor served as the pixel switch 55 may be the semiconductor film made in accordance with the above-described manufacturing method of the present invention. Of the pixel driving circuitry, a gate line driver 58, which is a circuit for driving gate lines and a data line driver 59, which is a circuit for driving data lines are formed on a same glass substrate to form an active matrix substrate 51.

In accordance with the liquid crystal display device of the preferred embodiment, a large size semiconductor film may be formed on a glass substrate at a high throughput. This device will be suitable for the formation of thin film transistors used as pixel switches of an image display device, which is often required to have a large surface area. In addition the thin film transistors formed in accordance with the above manufacturing method may be incorporated to the pixel driver circuit in the periphery of the pixel circuit that is required to be high performance, because a semiconductor film having a relatively large size of crystal grain can be obtained. Since the semiconductor film in accordance with the preferred embodiment may have in general large crystal grain size in the modulation direction, that is the growth direction, or in the long axis direction for example, the thin film transistor channel may have a higher electron mobility by being arranging in the long axis direction.

When the area dedicated for peripheral circuitry (pixel drivers, etc.) is formed with thin film transistors on the glass substrate that forms the active matrix substrate 51, it is preferable that the channel direction of the thin film transistors of larger driving power may be directed into the growth direction. On the other hand pixel circuit zone does not need relatively high mobility, so that the direction of thin film transistor channel may be placed in either the major or short axis direction. Also, by using a process step for decreasing the anisotropy as shown in FIGS. 13 and 14, the performance of thus obtained thin film transistor may not be depending on the direction. Therefore the direction of thin film transistor channel may be in either direction for the circuitry.

Figure 18:
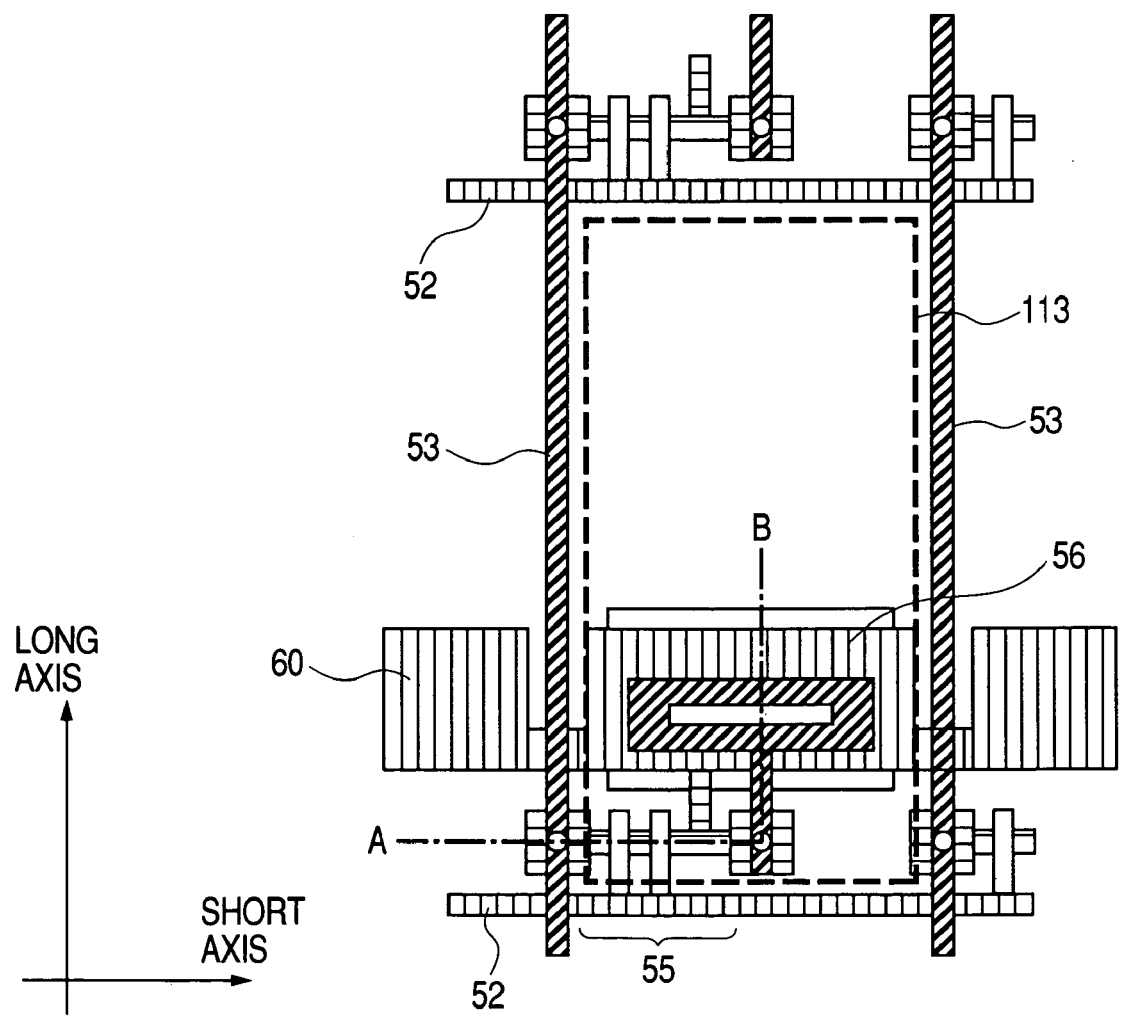
FIG. 18 is a plan view illustrating an arrangement of one pixel part of a semiconductor device to be used in a liquid crystal display device formed by using the semiconductor thin film in accordance with the manufacturing method of the present invention.

Referring to FIG. 18, there is shown a schematic plan view illustrating an exemplary configuration of one pixel of a semiconductor device used for an liquid crystal display device formed by using the semiconductor thin film in accordance with the manufacturing method of the present invention. The liquid crystal display device may operate Liquid crystal sandwiched between an active matrix substrate having thin film transistors formed thereon and an opposite substrate. In FIG. 18 only the active matrix substrate having thin film transistors formed thereon is shown.

Figure 19:
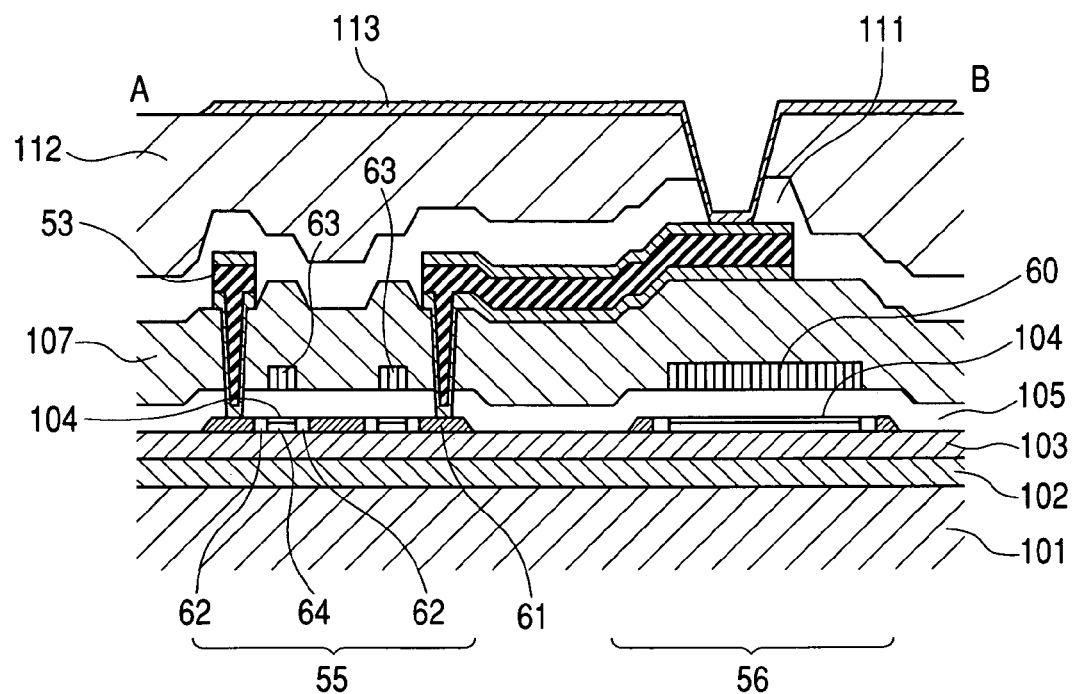
FIG. 19 is a cross sectional view taken along the dashed lines A–B of FIG. 18.

Referring to FIG. 19, there is shown a cross sectional view taken along the dashed line A-B of FIG. 18. The polycrystalline Si film in accordance with the manufacturing method of the present invention, is the semiconductor film 104 having its periodicity in the long axis direction, which is used for the thin film transistors forming the pixel switch 55, and the storage capacitor 56. The capacitor 56 is connected to the source or drain 61 of a thin film transistor of the pixel switch 55, the other is connected to a pixel electrode 113 to maintain the voltage applied to the pixel electrode 113. The pixel switch 55 is a thin film transistor of double gate type, which has two gates. At the bottom end of gate 63 of the semiconductor film 104 an LDD 62 of n-type domain, which is more lightly doped than the source or drain 61, is provided to control the leak current. The reference numeral 53 designates to a data line, 60 to a common line, 64 to a channel, 101 to a glass substrate, 102 to a SiN undercoat film, 103 to a $SiO_2$ undercoat film, 105 to a gate dielectric layer, 107 to an interlayer dielectric layer, 112 to an organic protection film, and 113 to a pixel electrode.

The direction of the thin film transistor channel of the pixel switch 55 is in the short axis direction, perpendicular to the period direction of the above described semiconductor film. Although the driving power is less than the thin film transistor having channel arranged in the long axis direction, there may be a sufficient performance for driving the liquid crystal display. The capacitor 56 on the other hand will be used by applying a positive voltage to the common line 60 to induce carriers to the underlying semiconductor film 104. By aligning the current direction to the direction in which the mobility of the semiconductor film is maximum, the resistance of the semiconductor film connected to the capacitor 56 will decrease, allowing more rapid operation. In the example shown in FIG. 18 the current will flow through the long axis direction in the underlying semiconductor film 104 of the capacitor 56, such that the long axis is directed to the largest grain size.

Figure 20:
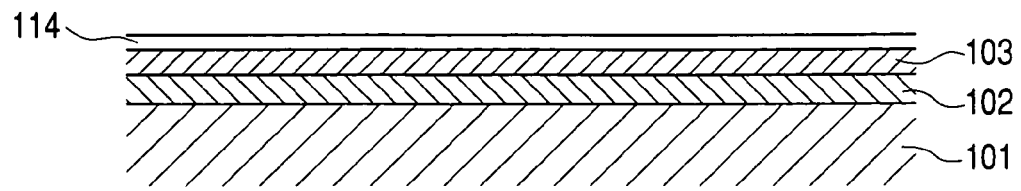
FIG. 20 is a schematic diagram depicting process steps of manufacturing an active matrix substrate shown in FIG. 19.
Figure 21:
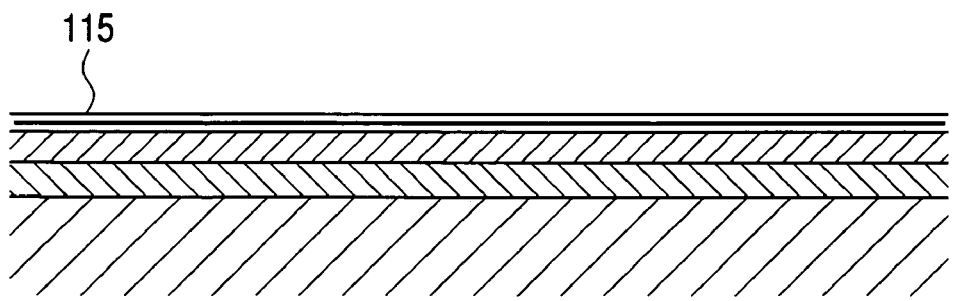
FIG. 21 is a schematic diagram depicting process steps of manufacturing an active matrix substrate shown in FIG. 19, next to FIG. 20.

Referring to FIGS. 20 to 25, there are shown schematic diagrams of manufacturing processes of the active matrix substrate shown in FIG. 19. At first, as shown in FIG. 20, On a glass substrate 101, 140 nm thickness of SiN undercoat film 102, 100 nm thickness of $SiO_2$ undercoat film 103, 40 nm thickness of amorphous Si film 114 are sequentially deposited by using plasma CVD method. After dehydrogenizing process of the amorphous Si film by the annealing at 400 C. degrees 10 minutes, pulsed excimer laser is irradiated to crystallize. The crystallization process uses laser beam of 1-μm period, modulated by a phase shift mask of 2-μm pitch, randomly moved in the modulation direction of the laser beam. 10 shots of exposure may yield a polycrystalline Si 115 as shown in FIG. 21, consisted of crystalline of grain size of approximately 1 μm in the period direction.

Figure 22:
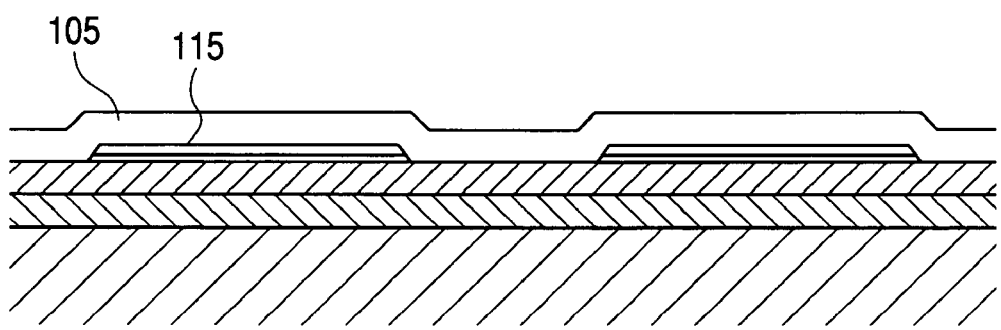
FIG. 22 is a schematic diagram depicting process steps of manufacturing an active matrix substrate shown in FIG. 19 next to FIG. 21.
Figure 23:
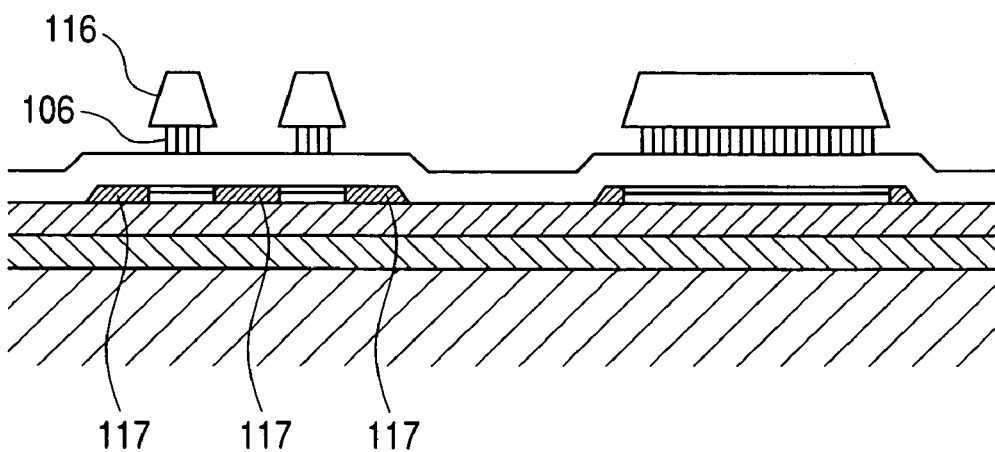
FIG. 23 is a schematic diagram depicting process steps of manufacturing an active matrix substrate shown in FIG. 19, next to FIG. 22.

The polycrystalline Si 115 will be processed by a photolithograph to shape as island, $SiO_2$ film of 130 nm thickness for a gate dielectric film 105 will be deposited by plasma CVD using TEOS (tetraethoxisilane) (see FIG. 22). A MoW (Molybdenum-Tungsten alloy) film 106 for the gate will be sputtered on the gate dielectric film 105 to a thickness of 150 nm. After forming MoW film 106, coating with a resist, mask exposure, and development will be sequentially performed to develop a resist pattern 116 (see FIG. 23). Using the resist as a mask, the MoW film 106 will be etched with a mixture solution of phosphoric acid, nitric acid, acetic acid and water. As shown in FIG. 23, The MoW film 106 will be etched to a shape receded by 1 μm from the resist 116 to form a gate. Thereafter, P ions for n-type dopant will be implanted at the acceleration voltage of 60 KeV, at the doze of $10^15$ per square centimeter, using the resist as mask, to dope into the Si film of the area uncovered by the resist to form an n-type doped region 117 to yield a structure shown in FIG. 23.

Figure 24:
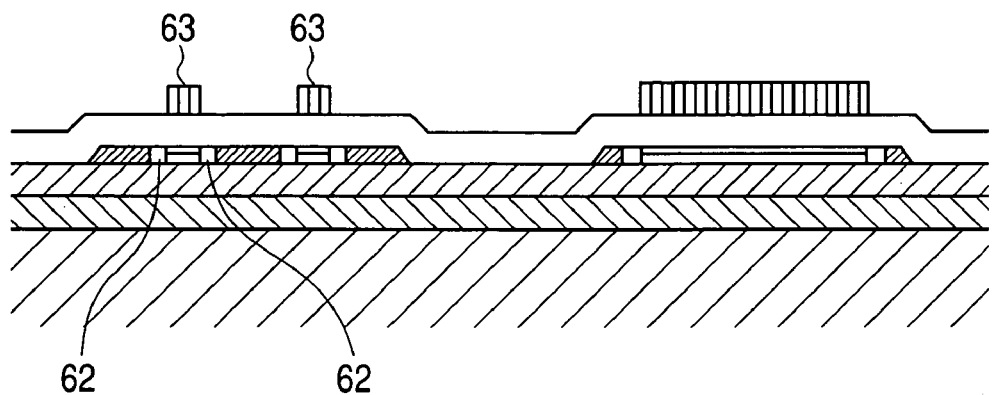
FIG. 24 is a schematic diagram depicting process steps of manufacturing an active matrix substrate shown in FIG. 19, next to FIG. 23.
Figure 25:
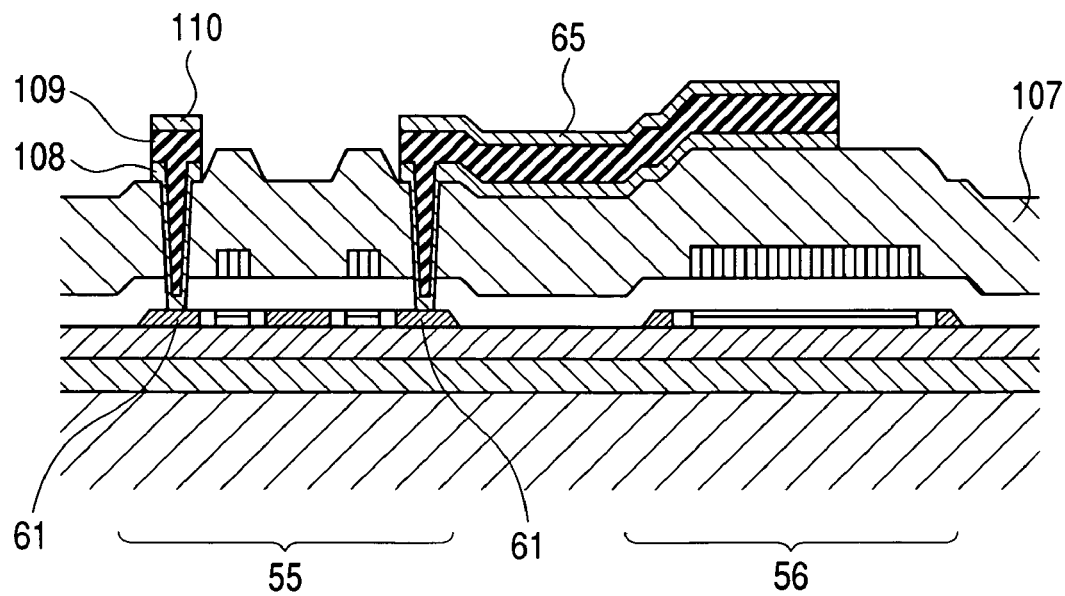
FIG. 25 is a schematic diagram depicting process steps of manufacturing an active matrix substrate shown in FIG. 19 next to FIG. 24.

After removing the resist, as shown in FIG. 24, a gate 63 will be used as mask to implant P ions at the acceleration voltage of 70 KeV, at the doze of $10^13$ per square centimeter, to form an LDD 62 of the length of 1 μm of self alignment at an end of the gate. Then, as shown in FIG. 25, interlayer dielectric film 107 of the thickness 500 nm will be deposited using the plasma CVD with TEOS, annealed 1-hour 450° C. degrees to activate injected P ions to form the source or drain 61. Then a photolithographic process will be performed using a hydrofluoric acid treatment solution or dry etch of fluorides to pierce the contact holes. Thereafter, a sputter will be used to deposit an MoW film 108 for wirings, an aluminium alloy film 109 and an MoW film 110 to the thickness of 100 nm, 400 nm, and 50 nm, respectively. Then a wet etch will be performed to process these layer to wirings 65 to obtain a structure shown in FIG. 25.

Then, a protective layer (passivation layer) of SiN 111 of thickness 300 nm will be formed using the plasma CVD, as shown in FIG. 19, then the substrate will be annealed 30 minutes 400 C. degrees in the nitrogen environment to terminate the defects in Si film and defects of interface between the Si film and gate dielectric film. Then an organic protective layer 112 shown in FIG. 19 will be applied. An exposure and development process will be then performed to form through holes used for the connection to the pixel electrode 113, and responsive sputtering to form transparent conductive layer made of ITO (Indium-Tin-Oxide) for the pixel electrodes. A photolithographic process step will be then performed to form pixel electrodes 113 to obtain an active matrix substrate having thin film transistors formed thereon as shown in FIG. 19. Thereafter, a directive layer for directing liquid crystal to the upper layer of the pixel electrodes will be applied thereon and directive controllability will be added by rubbing or light exposure.

Finally liquid crystal will be sealed between an opposite substrate having a color filter formed and the substrate to obtain a liquid crystal display device.

In this embodiment, only formation of n-type thin film transistor has been shown, however an active matrix substrate having CMOS thin film transistor circuit, including both n-type and p-type thin film transistors can be made by adding process steps of masking with a resist any necessary regions, and implanting Boron ion instead of Phosphor ion. Also, in this embodiment dielectric substrate of the active matrix substrate has been made of glass plate, however the dielectric substrate may not be limited thereto, any other suitable materials including plastics and isolated metallic plate can be used instead.

For a plastic substrate, which is likely to have some lateral size error caused by the thermal inflation by the heat of laser beam exposure a precise registration may be required such as SLS method of the prior art, however this may cause defects of film because of registration error. The manufacturing method of semiconductor thin film in accordance with the present invention does not require any registration, may be applied without difficulties to such a plastic substrate. In accordance with a preferred embodiment of the manufacturing method, the present invention may have advantages that mean fluence may be decreased in comparison with ELA method, which does not use a phase shift mask, and that damages to the substrate may be decreased since a fewer number of shots may yield a comparable crystal.

Figure 26:
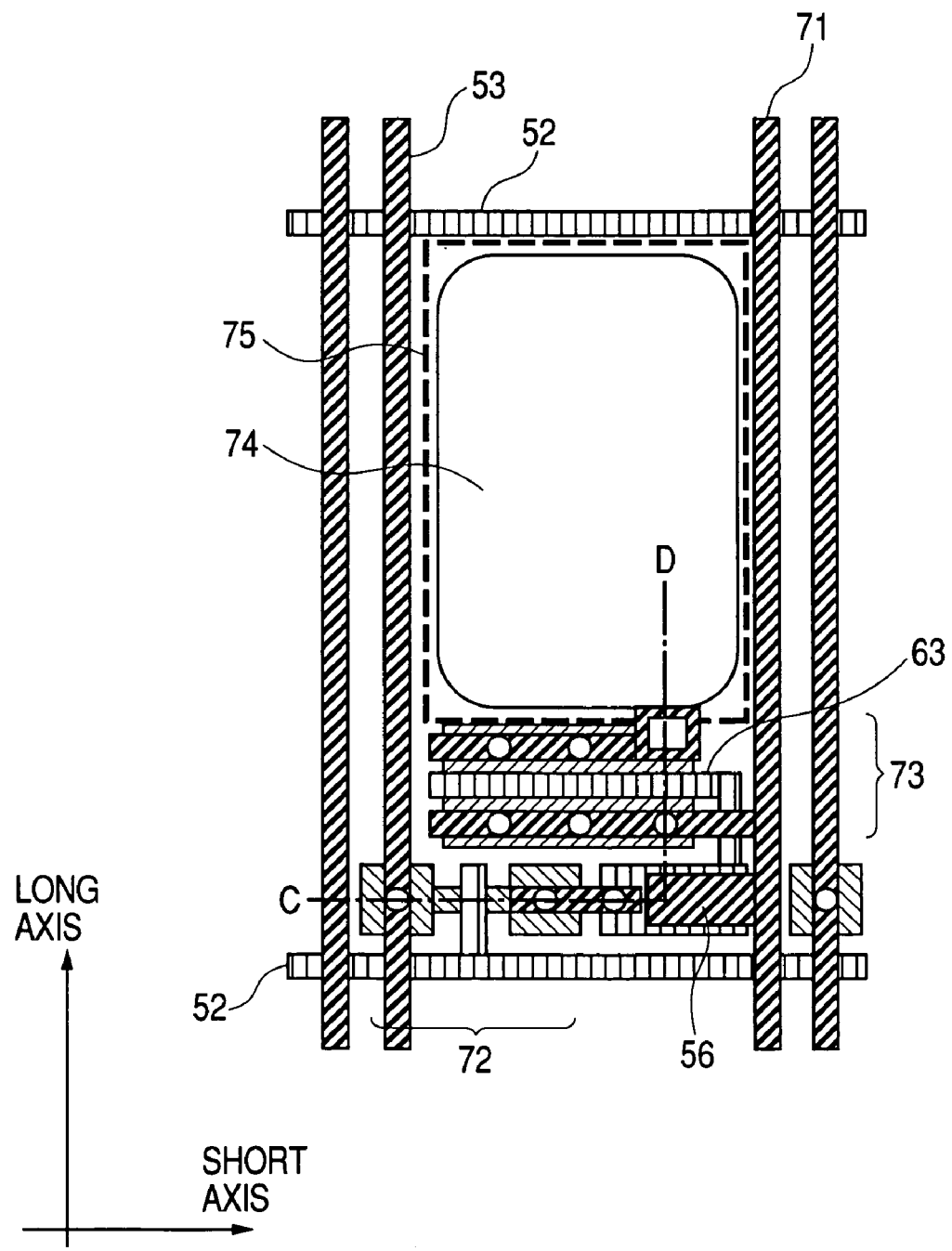
FIG. 26 is a schematic diagram of an exemplary image display device incorporating organic electroluminescence elements by means of an active matrix substrate made by the manufacturing method of the present invention.

Referring to FIG. 26, there is shown an exemplary image display device using organic electroluminescence elements using the active matrix substrate made by the manufacturing method in accordance with the present invention. An image display device using organic electroluminescence elements (organic electroluminescence display device), as similar to liquid crystal display devices, may have a plurality of intersecting wirings and pixels in the vicinity of intersections formed on a dielectric substrate such as a glass plate. In FIG. 26, there is shown a schematic plan view of one exemplary pixel. The organic electroluminescence device in accordance with the preferred embodiment emits light through the substrate, requiring cathodes made of Al alloy on the top surface. In FIG. 26 these cathodes are not indicated for the sake of clarity.

Figure 27:
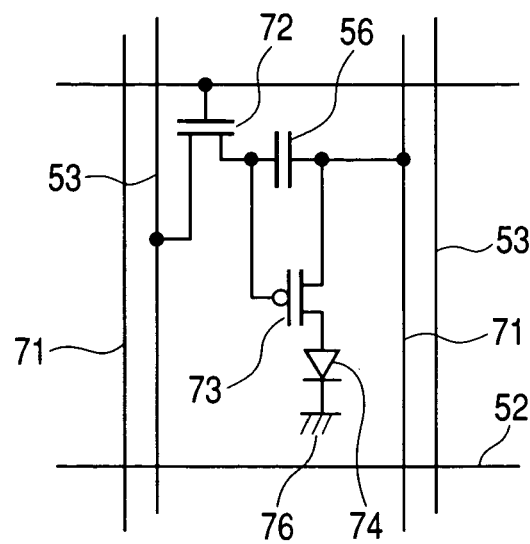
FIG. 27 is a schematic diagram of an equivalent circuitry of the organic electroluminescence element shown in FIG. 26.
Figure 28:
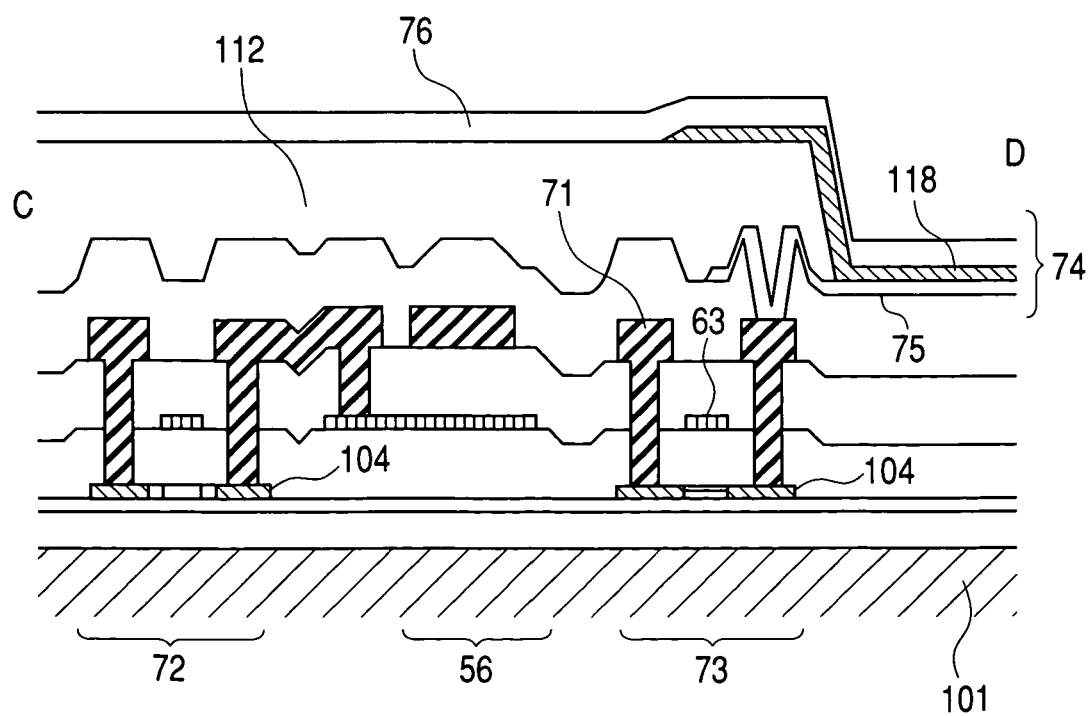
FIG. 28 is a cross sectional view taken along the line C–D of FIG. 26.

Referring to FIG. 27, there is shown a schematic diagram of equivalent circuitry of an organic electroluminescence element, in which the reference numerals identical to those in FIG. 26 designate to the same or similar components. FIG. 28 shows a cross sectional view taken along the line C-D of FIG. 26. In FIG. 28, the semiconductor film 104 having a periodicity in the long axis direction, manufactured in accordance with the manufacturing method of the present invention, is formed on a glass substrate 101 to form an n-type thin film transistor 72 having LDD created. The reference numeral of the undercoat layer on the glass substrate 101 is not shown in the figure. The semiconductor film 104 having a periodicity in the long axis direction, manufactured in accordance with the manufacturing method of the present invention, is formed on a glass substrate 101 to align the channel direction and the periodicity direction to form a p-type thin film transistor 73 thereon with the length of gate being a periodicity times a multiple of natural number. The n-type thin film transistor 72 will be turned on by the voltage applied to the gate line 52 to charge the capacitor 56 with the signal voltage of the data line 53.

After charging, gate line voltage will turn off the n-type thin film transistor 72 to retain the signal voltage in the capacitor 56. A transparent electrode 75, which is connected to the p-type thin film transistor 73, has an organic electroluminescence element 74 including an organic film 118 composed of a hole transfer layer, light emitting layer, and electron transfer layer, and a cathode 76 of Al alloy deposited on the entire surface. The gate 63 of the p-type thin film transistor 73 is applied with a voltage retained in the capacitor 56, which controls the current flowing through the organic electroluminescence element 74 to a potential corresponding to the retained voltage to adjust the amount of light emission of the organic electroluminescence element 74.

The semiconductor film on an active matrix substrate, made by the manufacturing method of an active matrix substrate in accordance with the present invention, may be a film with a constant grain size in the periodicity direction. When forming a thin film transistor that flows current through the periodicity direction, the fluctuation of current may be decreased. In particular, when forming a thin film transistor with a channel of the length of the periodicity times an integer, the number of grain boundaries included in the channel will be constant to allow improvement of homogeneity. Therefore in a device in which the image display may be affected by the current fluctuation of thin film transistor driving the light emitting element, such as an image display device using the organic electroluminescence element, the homogeneity of displayed image may be improved by forming the semiconductor film of the present invention for the channel, forming the channel in the periodicity direction of the semiconductor layer, and using a thin film transistor for driving the organic electroluminescence element with the channel length of an integer times the periodicity.

Although in the above described preferred embodiments, there has been described a manufacturing method of an active matrix substrate included in an image display device such as liquid crystal display device and organic electroluminescence element, as well as an image display device using the active matrix substrate, it should be understood by those skilled in the art that the present invention may not be limited thereto. The present invention may also be applied equivalently to any other various semiconductor devices using a dielectric substrate such as semiconductor film wafer.

In accordance with present invention, a semiconductor film for forming a semiconductor device such as a highs performance thin film transistor may be manufactured at lower cost and higher throughput. A semiconductor device including a high performance active matrix substrate thereby may be manufactured at lower cost, enabling to provide an image display device, which may display a high quality image, by incorporating the active matrix substrate of the present invention as a component.

What is claimed is:

1. A method of manufacturing an active matrix substrate, wherein
a laser beam is repeatedly exposed to a semiconductor film formed on a dielectric substrate of an active matrix substrate to produce a polycrystallized semiconductor film, comprising:
intensity modulating said laser beam;
directing and shaping said laser beam to be periodic in at least one direction: and
moving randomly the intensity distribution of the laser beam on said semiconductor film in the periodic direction of said intensity modulation,
wherein a coordinate y on said semiconductor film in the periodic direction of said intensity modulation at the point where the laser beam intensity becomes a maximum at the time of said laser beam exposure, is given by $$y=na+r$$

where a designates a periodicity of intensity modulation of said laser beam, n designates an integer, r designates a non-negative value smaller than a and which is determined for each exposure, and
in which the difference between the maximum and minimum values of said r is a half or more of periodicity.

2. A method of manufacturing an active matrix substrate, wherein
a laser beam is repeatedly exposed to a semiconductor film formed on a dielectric substrate of an active matrix substrate to produce a polycrystallized semiconductor film, comprising:
intensity modulating said laser beam;
directing and shaping said laser beam to be periodic in at least one direction;
moving randomly the intensity distribution of the laser beam on said semiconductor film in the periodic direction of said intensity modulation;
melting, by the exposure of said laser beam, an area smaller than a crystal grain on the crystallized semiconductor film obtained by exposure of said laser beam on said semiconductor film to divide said semiconductor film; and
promoting crystallization around the cores of plural crystal grains thus divided to reconstruct a single crystal grain.

3. A method of manufacturing an active matrix substrate, wherein
a laser beam is repeatedly exposed to a semiconductor film formed on a dielectric substrate of an active matrix substrate to produce a polycrystallized semiconductor film, comprising:
intensity modulating said laser beam;
directing and shaping said laser beam to be periodic in at least one direction;
moving randomly the intensity distribution of the laser beam on said semiconductor film in the periodic direction of said intensity modulation; and
forming, in the periodic direction of the intensity modulation of said laser beam, the polycrystalline semiconductor film having a grain size approximately equivalent to a periodicity of said intensity modulation.

4. A method for manufacturing an active matrix substrate including process steps of exposing a laser beam a plurality of times to a semiconductor film formed on a dielectric substrate of the active matrix substrate to crystallize said semiconductor film comprising:
providing a long axis and a short axis of exposure shape on said semiconductor film to said laser beam and providing a rectangular form laser beam having a periodic intensity modulation in said long axis direction;
moving said laser beam in relation to said dielectric substrate in said short axis direction of said laser beam to said semiconductor film for exposing said semiconductor film a plurality of times to crystallize said semiconductor film;
moving randomly the intensity modulation of said laser beam on the semiconductor film formed on said dielectric substrate from one laser beam exposure position to another laser beam exposure position in said long axis direction; and
using a phase shift mask having a periodicity of the periodicity of said intensity modulation times an integer more than two to maintain a constant distance between said semiconductor film and said phase shift mask to provide periodic intensity modulation of said laser beam.

5. A method for manufacturing an active matrix substrate including process steps of exposing a laser beam a plurality of times to a semiconductor film formed on a dielectric substrate of the active matrix substrate to crystallize said semiconductor film, comprising:
providing a long axis and a short axis of exposure shape on said semiconductor film to said laser beam and providing a rectangular form laser beam having a periodic intensity modulation in said long axis direction;
moving said laser beam in relation to said dielectric substrate in said short axis direction of said laser beam to said semiconductor film for exposing said semiconductor film a plurality of times to crystallize said semiconductor film; and
moving randomly the intensity modulation of said laser beam on the semiconductor film formed on said dielectric substrate from one laser beam exposure position to another laser beam exposure position in said long axis direction, in which
coordinate y on said semiconductor film in the periodic direction of said intensity modulation at the point where the laser beam intensity becomes maximum at the time of said laser beam exposure, is given by $$y=na+r$$

where a designates a periodicity of intensity modulation of said laser beam, n to an integer, r to a non-negative value smaller than a and determined for each exposure, and
in which the difference between the maximum and minimum values of said r is a half or more of periodicity.

6. A method for manufacturing an active matrix substrate including process steps of exposing a laser beam a plurality of times to a semiconductor film formed on a dielectric substrate of the active matrix substrate to crystallize said semiconductor film, comprising:
providing a long axis and a short axis of exposure shape on said semiconductor film to said laser beam and providing a rectangular form laser beam having a periodic intensity modulation in said long axis direction;
moving said laser beam in relation to said dielectric substrate in said short axis direction of said laser beam to said semiconductor film for exposing said semiconductor film a plurality of times to crystallize said semiconductor film;

moving randomly the intensity modulation of said laser beam on the semiconductor film formed on said dielectric substrate from one laser beam exposure position to another laser beam exposure position in said long axis direction;

melting, by the exposure of said laser beam, an area smaller than a crystal grain on the crystallized semiconductor film obtained by exposure of said laser beam on said semiconductor film to divide said semiconductor film; and promoting crystallization around the cores of plural crystal grains thus divided to reconstruct a single crystal grain.

7. A method for manufacturing an active matrix substrate including process steps of exposing a laser beam a plurality of times to a semiconductor film formed on a dielectric substrate of the active matrix substrate to crystallize said semiconductor film, comprising:

providing a long axis and a short axis of exposure shape on said semiconductor film to said laser beam and providing a rectangular form laser beam having a periodic intensity modulation in said long axis direction;

moving said laser beam in relation to said dielectric substrate in said short axis direction of said laser beam to said semiconductor film for exposing said semiconductor film a plurality of times to crystallize said semiconductor film;

moving randomly the intensity modulation of said laser beam on the semiconductor film formed on said dielectric substrate from one laser beam exposure position to another laser beam exposure position in said long axis direction; and forming, in the periodic direction of the intensity modulation of said laser beam, the polycrystalline semiconductor film having a grain size approximately equivalent to a periodicity of said intensity modulation.

8. A method of manufacturing an active matrix substrate, by exposing a semiconductor film formed on a dielectric substrate of an active matrix substrate with a laser beam a plurality of times to crystallize the semiconductor film, comprising:

exposing said semiconductor film to a pulsed laser beam having intensity modulated at first periodicity, and exposing said semiconductor film to a second modulated pulsed laser beam having a periodicity smaller than said first periodicity.

9. The method of claim 8, further comprising:

exposing, to said semiconductor film exposed with pulsed laser beam having intensity modulated at a first periodicity, a pulsed laser beam having a second periodicity of more than one fifth and less than a half of the modulation period of said first modulated pulsed laser beam in the direction perpendicular to said first periodicity.

10. A method of an active matrix substrate, by exposing a semiconductor film formed on a dielectric substrate of an active matrix substrate with a laser beam a plurality of times to crystallize said semiconductor film, compromising:

providing a long axis and short axis of exposure shape on said semiconductor film to said laser beam and providing a rectangular form having a periodic intensity modulation in said long axis direction;

moving said laser beam in relation to said dielectric substrate in said short axis direction of said rectangular laser beam to said semiconductor film for exposing said semiconductor film a plurality of times to crystallize said semiconductor film;

wherein exposure occurs by:

exposing said semiconductor film exposed with first modulated pulsed laser beam having intensity modulated at a first periodicity in the short axis direction of said rectangular shape, and exposing a second pulsed laser beam having a second periodicity of more than one fifth and less than a half of the modulation period of said first modulated pulsed laser beam in the direction perpendicular to said first periodicity; and moving randomly on said semiconductor film the intensity modulation of said laser beam having said second periodicity in said long axis direction from one pulse laser beam exposure position to another exposure position.

11. A method of manufacturing an active matrix substrate, comprising:

exposing a laser beam repeatedly to a semiconductor film formed on a dielectric substrate of an active matrix substrate to produce a polycrystallized semiconductor film, wherein the exposing comprises:

intensity modulating an intensity distribution of said laser beam;

directing and shaping said laser beam to be periodic in shape along a long axis direction; and moving randomly said intensity distribution of the laser beam on said semiconductor film in said long axis direction within a range as said semiconductor film is moved at a constant speed along a short axis direction perpendicular to said long axis;

melting, by said exposing of said laser beam, an area smaller than a crystal grain on the crystallized semiconductor film obtained by exposure of said laser beam on said semiconductor film to divide said semiconductor film; and promoting crystallization around cores of plural crystal grains thus divided to reconstruct a single larger crystal grain.

12. The method of claim 11 further comprising:

dividing the semiconductor film into at least a top area and a bottom area along said long axis;

exposing said laser beam first to said top area, starting at a random top starting point along said long axis and finishing at random top finishing point along said long axis as said semiconductor film is moved along said short axis at said constant speed;

moving said semiconductor film diagonally and backwards along said short axis with no laser exposure to a random bottom starting point along said long axis and;

exposing said laser beam to said bottom area starting at said random bottom starting point along said long axis and finishing at a random top finishing point along said long axis as said semiconductor film is moved along said short axis at said constant speed; and thereby exposing said top area and said bottom area in multiple passes of said laser beam along said short axis.

* * * * *